US012638885B2

(12) United States Patent
Kim et al.

(10) Patent No.: US 12,638,885 B2
(45) Date of Patent: May 26, 2026

(54) DISPLAY DEVICE AND MANUFACTURING METHOD THEREOF

(71) Applicant: Samsung Display Co., Ltd., Yongin-Si (KR)

(72) Inventors: Byunghoon Kim, Yongin-si (KR); Taeoh Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 171 days.

(21) Appl. No.: 18/513,645

(22) Filed: Nov. 20, 2023

(65) Prior Publication Data

US 2024/0241545 A1    Jul. 18, 2024

(30) Foreign Application Priority Data

Jan. 18, 2023    (KR) ........................ 10-2023-0007092

(51) Int. Cl.
*G06F 1/16* (2006.01)
*H01L 25/075* (2006.01)
*H10W 90/00* (2026.01)

(52) U.S. Cl.
CPC .......... *G06F 1/1652* (2013.01); *G06F 1/1656* (2013.01); *H10W 90/00* (2026.01)

(58) Field of Classification Search
CPC ... G06F 1/1652; G06F 1/1656; H01L 25/0753
USPC ........................................................ 428/167
See application file for complete search history.

(56) References Cited

U.S. PATENT DOCUMENTS

| | | | |
|---|---|---|---|
| 10,008,695 B2 | 6/2018 | Park et al. | |
| 2017/0155084 A1* | 6/2017 | Park | H10K 59/40 |
| 2021/0107829 A1* | 4/2021 | Chen | G06F 1/1626 |
| 2021/0141417 A1* | 5/2021 | Seo | G06F 1/1616 |
| 2022/0015253 A1* | 1/2022 | Park | H04M 1/0214 |
| 2022/0155821 A1* | 5/2022 | Kim | G09G 3/03 |
| 2022/0208030 A1* | 6/2022 | Kim | G02B 1/11 |
| 2023/0037126 A1* | 2/2023 | Kim | G06F 1/1643 |

FOREIGN PATENT DOCUMENTS

| | | |
|---|---|---|
| KR | 10-2022-0007801 A | 1/2022 |
| KR | 10-2416914 B1 | 7/2022 |
| KR | 10-2423407 B1 | 7/2022 |

* cited by examiner

*Primary Examiner* — Tahseen Khan
(74) *Attorney, Agent, or Firm* — Innovation Counsel LLP

(57) ABSTRACT

A display device includes a display panel, a window, and a window protection layer. The display panel includes a first non-folding region, a second non-folding region, and a folding region which is foldable and disposed between the first non-folding region and the second non-folding region. The first non-folding region, the second non-folding region, and the folding region each include light emitting regions in which light emitting elements respectively overlap and a non-light emitting region disposed between the light emitting regions. The window is disposed on the display panel. The window protection layer has at least one groove overlapping the folding region defined therein, and is disposed on the window. The groove overlaps the non-light emitting region of the folding region when viewed on a plane.

20 Claims, 21 Drawing Sheets

DP-DA

NLA LA NLA

DM

LD

310-OP AE EL CE PDL-OP 330
320 } ARL
310
240

230
220 } IS
210

TFE3
TFE2 } TFE
TFE1

PDL } DP-EL

IL8

IL7

CNE2

CNE1

BML2-C SP2

IL6

IL5
IL4 } DP-CL

IL3

SP1

IL2

IL1

BFL

BL

DE2 GT2 AC2 SE2 BMLb BMLa DE1 AC1 GT1 SE1 CE10 CE20

O-TFT S-TFT Cst

DISPLAY DEVICE AND MANUFACTURING METHOD THEREOF

CROSS-REFERENCE TO RELATED APPLICATIONS

This U.S. non-provisional patent application claims priority under 35 U.S.C. § 119 of Korean Patent Application No. 10-2023-0007092, filed on Jan. 18, 2023, the entire contents of which are hereby incorporated by reference.

BACKGROUND

The present disclosure relates to a display device and a manufacturing method thereof, and more particularly, to a display device including a window protection layer in which grooves are defined.

A display device includes a display region activated in response to electrical signals. The display device senses inputs applied from the outside through the display region and concurrently displays various images, and may thus provide information to users. Recently, as various types of display devices have been developed, display regions having a variety of different shapes have been implemented.

SUMMARY

The present disclosure may provide a display device having improved folding properties and improved impact resistance.

An embodiment of a display device includes a display panel including a first non-folding region, a second non-folding region, and a folding region which is foldable and disposed between the first non-folding region and the second non-folding region, wherein the first non-folding region, the second non-folding region, and the folding region each include light emitting regions in which light emitting elements respectively overlap and a non-light emitting region disposed between the light emitting regions, a window disposed on the display panel, and a window protection layer having at least one groove overlapping the folding region defined therein, and disposed on the window, wherein the groove overlaps the non-light emitting region of the folding region when viewed on a plane.

In an embodiment, the display device may further include an upper protection layer disposed on the window protection layer and filling the groove.

In an embodiment, the window protection layer and the upper protection layer may have the same refractive index.

In an embodiment, the window protection layer may have a thickness of about 100 μm or more and about 350 μm or less.

In an embodiment, a depth of the groove may be smaller than a thickness of the window protection layer by about 50 μm or more and about 80 μm or less.

In an embodiment, a width of the groove may be smaller than a distance between the light emitting elements.

In an embodiment, the groove may include at least one first groove extending in a first direction and disposed between the light emitting elements and at least one second groove extending along a second direction crossing the first direction and disposed between the light emitting elements.

In an embodiment, the first groove may be defined in plurality, each of the first grooves may have the same depth, the second groove may be defined in plurality, and each of the second grooves may have the same depth.

In an embodiment, some of the light emitting elements may be disposed between the mutually adjacent first grooves, the some of the light emitting elements may define at least one light emitting element row, and the at least one light emitting element row may extend in the first direction.

In an embodiment, a first distance between a (1-1)-th groove, which is one of the first grooves, and a (1-2)-th groove closest to one side of the (1-1)-th groove may be greater than a second distance between the (1-1)-th groove and a (1-3)-th groove closest to the other side of the (1-1)-th groove.

In an embodiment, one of the light emitting elements may be surrounded by the first groove and the second groove.

In an embodiment, a depth of the first groove may be the same as a depth of the second groove.

In an embodiment, some of the light emitting elements may define n first light emitting element rows between the mutually closest first grooves, some of the light emitting elements may define m second light emitting element rows between the mutually closest second grooves, and the n and the m may be different natural numbers.

In an embodiment, the number of the light emitting element rows disposed between the mutually closest first grooves may be the same.

An embodiment of a method of manufacturing a display device includes preparing a preliminary display device including a display panel including a first non-folding region, a second non-folding region, and a folding region which is foldable and disposed between the first non-folding region and the second non-folding region, wherein the first non-folding region, the second non-folding region, and the folding region each include light emitting regions in which light emitting elements respectively overlap and a non-light emitting region disposed between the light emitting regions, a window disposed on the display panel, and a window protection layer disposed on the window, determining coordinates of each of the light emitting elements, using an inspection instrument, and forming a groove overlapping the non-light emitting region of the folding region in the window protection layer.

In an embodiment, the method may further include forming an upper protection layer disposed on the window protection layer and filling the groove.

In an embodiment, the window protection layer may have a thickness of about 100 μm or more and about 350 μm or less.

In an embodiment, a depth of the groove may be smaller than a thickness of the window protection layer by about 50 μm or more and about 80 μm or less.

In an embodiment, a width of the groove may be smaller than a distance between the light emitting elements.

In an embodiment, the window protection layer and the upper protection layer may have the same refractive index.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIG. 11 is a cross-sectional view along V-V' of FIG. 10 according to an embodiment of the inventive concept;

FIGS. 17, 18, 19, and 20 are cross-sectional views showing a method for manufacturing a display device according to an embodiment of the inventive concept.

DETAILED DESCRIPTION

Figure 1A:
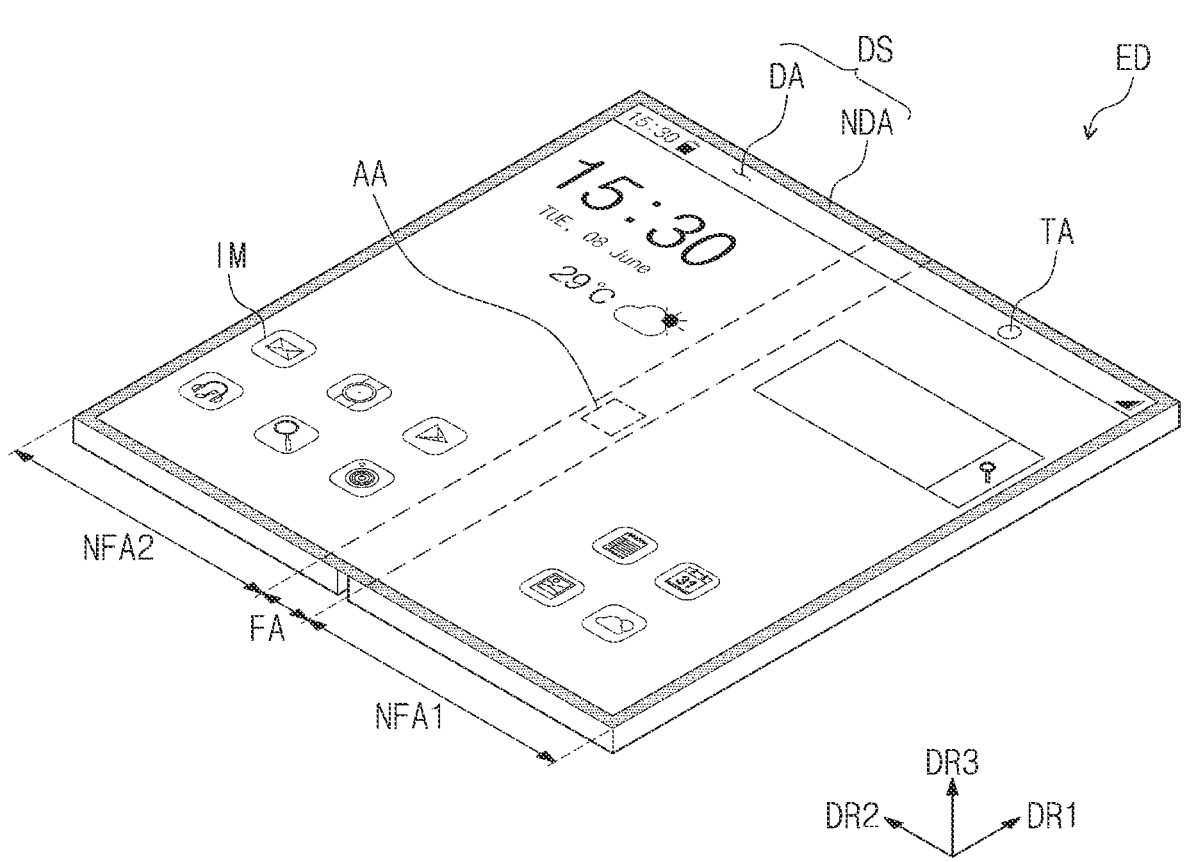
FIGS. 1A, 1B, and 1C are perspective views of an electronic device according to an embodiment of the inventive concept.

In the present description, when an element (or a region, a layer, a portion, and the like) is referred to as being "on," "connected to," or "bonded to" another element, it means that the element may be directly disposed on/connected to/bonded to the other element, or that a third element may be disposed therebetween.

Like reference numerals refer to like elements. In addition, in the drawings, the thickness, the ratio, and the dimensions of elements are exaggerated for an effective description of technical contents. As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B."

It will be understood that, although the terms first, second, and the like may be used herein to describe various elements, these elements should not be limited by these terms. These terms are only used to distinguish one element from another element. For example, a first element may be referred to as a second element, and similarly, a second element may be referred to as a first element without departing from the teachings of the present disclosure. The singular forms are intended to include the plural forms as well, unless the context clearly indicates otherwise.

Also, terms of "below", "on lower side", "above", "on upper side", or the like may be used to describe the relationships of the components shown in the drawings. The terms are used as a relative concept and are described with reference to the direction indicated in the drawings.

It should be understood that the terms "comprise," "include," and "have" as well as their variations such as "comprising" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the present disclosure belongs. In addition, terms, such as those defined in commonly used dictionaries, should be interpreted as having a meaning that is consistent with their meaning in the context of the relevant art and should not be interpreted in an idealized or overly formal sense unless expressly so defined herein.

Hereinafter, embodiments of the inventive concept will be described with reference to the accompanying drawings.

Figure 1B:
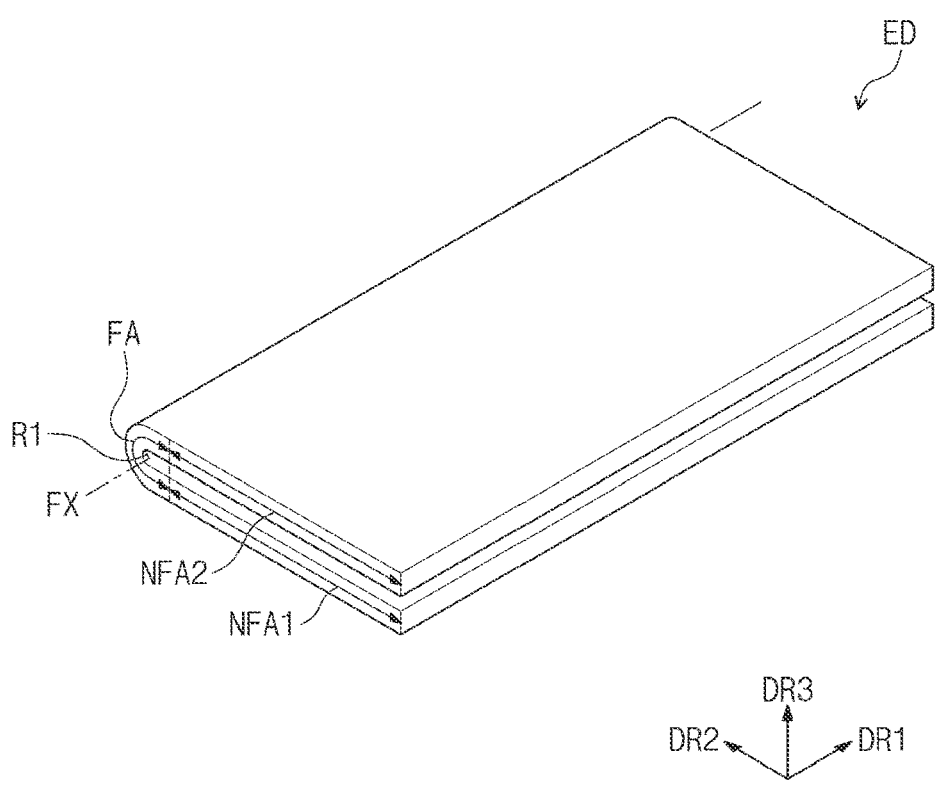
Figure 1C:
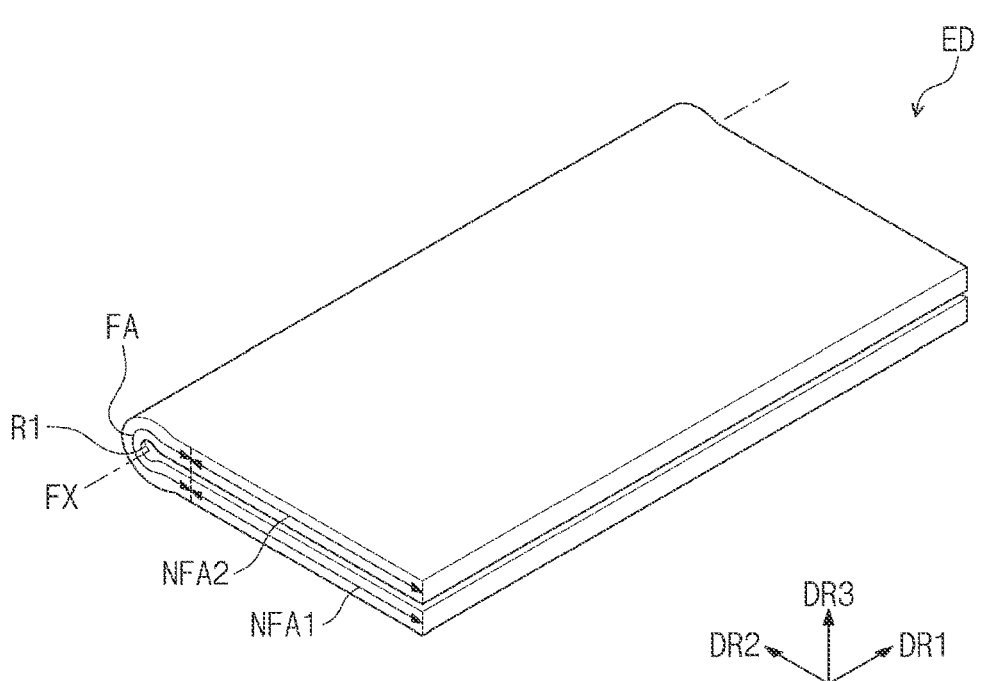

FIGS. 1A to 1C are perspective views of an electronic device ED according to an embodiment of the inventive concept. FIG. 1A shows an unfolded state, and FIGS. 1B and 1C show a folded state.

Referring to FIGS. 1A to 1C, the electronic device ED according to an embodiment of the inventive concept may include a display surface DS defined by a first direction DR1 and a second direction DR2 crossing the first direction DR1. The electronic device ED may provide an image IM to users through the display surface DS.

The display surface DS may include a display region DA and a non-display region NDA around the display region DA. The display region DA may display the image IM, and the non-display region NDA may not display the image IM. The non-display region NDA may surround the display region DA. However, the embodiment of the inventive concept is not limited thereto, and the shape of the display region DA and the shape of the non-display region NDA may be modified.

The display surface DS may include a sensing region TA. The sensing region TA may be a partial region of the display region DA. The sensing region TA has higher transmittance than other regions of the display region DA. Hereinafter, other areas of the display region DA except for the sensing region TA may be defined as a general display region.

Optical signals, for example, visible light or infrared light, may pass through the sensing region TA. The electronic device ED may capture external images through visible light passing through the sensing region TA or determine the accessibility of an external object through infrared light. Although one sensing region TA is shown as an example in FIG. 1A, the embodiment of the inventive concept is not limited thereto, and a plurality of sensing regions TA may be provided.

Hereinafter, a direction substantially perpendicularly crossing a plane defined by the first direction DR1 and the second direction DR2 is defined as a third direction DR3. Front and rear surfaces of each member are distinguished from each other with respect to the third direction DR3. In addition, as used herein, "when viewed on a plane" may be defined as a state viewed in the third direction DR3. Hereinafter, the first, second, and third directions DR1, DR2, and DR3 are directions respectively indicated by first, second, and third directional axes, and are assigned with the same reference numerals as those of the first, second, and third directional axes.

The electronic device ED may include a folding region FA and a plurality of non-folding regions NFA1 and NFA2. The non-folding regions NFA1 and NFA2 may include a first non-folding region NFA1 and a second non-folding region NFA2. In the second direction DR2, the folding region FA may be disposed between the first non-folding region NFA1 and the second non-folding region NFA2.

As shown in FIG. 1B, the folding region FA may be folded with respect to a folding axis FX parallel to the first direction DR1. The folding region FA has a predetermined curvature and a predetermined radius of curvature R1. The first non-folding region NFA1 and the second non-folding region NFA2 face each other, and the electronic device ED may be inner-folded such that the display surface DS is not exposed to the outside.

In an embodiment of the inventive concept, the electronic device ED may be outer-folded such that the display surface DS is exposed to the outside. In an embodiment of the inventive concept, the electronic device ED may be config-ured such that an inner-folding operation or an outer-folding operation is mutually repeated from an unfolding operation, but the embodiment of the inventive concept is not limited thereto. In an embodiment of the inventive concept, the electronic device ED may be configured to select any one of an unfolding operation, an inner-folding operation, or an outer-folding operation.

As shown in FIG. 1B, a distance between the first non-folding region NFA1 and the second non-folding region NFA2 may be substantially the same as the radius of curvature R1, but as shown in FIG. 1C, a distance between the first non-folding region NFA1 and the second non-folding region NFA2 may be smaller than the radius of curvature R1. FIGS. 1B and 1C are shown with respect to the display surface DS, and a housing constituting an outer portion of the electronic device ED may be in contact with end regions of the first non-folding region NFA1 and the second non-folding region NFA2.

Figure 2:
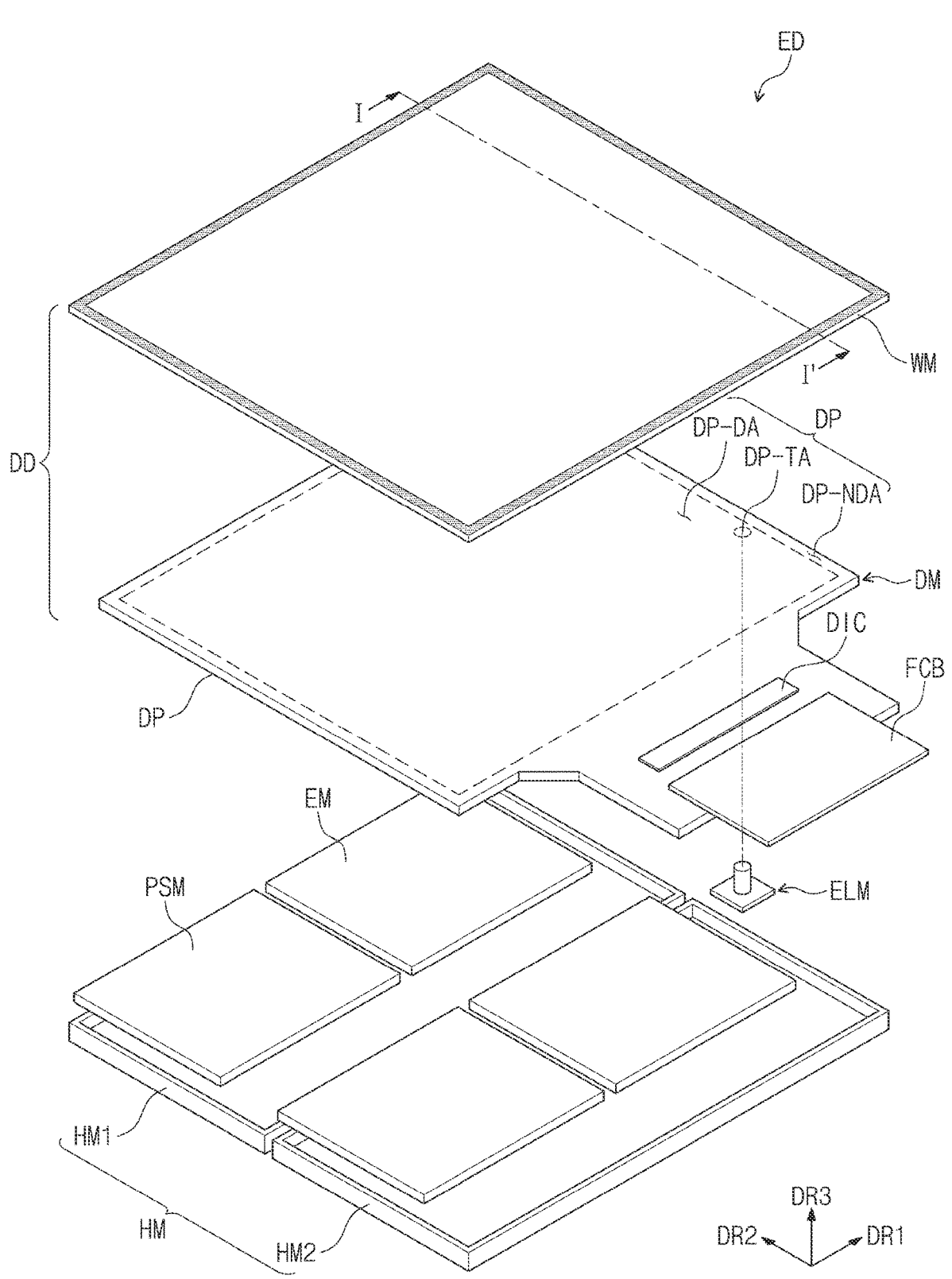
FIG. 2 is an exploded perspective view of an electronic device according to an embodiment of the inventive concept.

FIG. 2 is an exploded perspective view of an electronic device ED according to an embodiment of the inventive concept.

Referring to FIG. 2, the electronic device ED may include a display device DD, an electronic module EM, an electro-optical module ELM, a power module PSM, and a housing HM. Although not separately shown, the electronic device ED may further include a mechanical structure configured to control a folding operation of the display device DD.

The display device DD may generate images, and sense external inputs. The display device DD may include a window module WM and a display module DM. The win-dow module WM provides a front surface of the electronic device ED.

The display module DM may include at least a display panel DP. FIG. 2 shows only the display panel DP among the stack structures of the display module DM, but substantially, the display module DM may further include a plurality of components disposed at an upper side of the display panel DP. Detailed descriptions of the stacked structure of the display module DM will be described later.

The display panel DP is not particularly limited, and may include, for example, a light emitting display panel such as an organic light emitting display panel or a quantum dot light emitting display panel. The display panel DP may be a display panel including subminiature light emitting elements such as micro LEDs or nano LEDs.

The display panel DP includes a display region DP-DA and a non-display region DP-NDA corresponding to the display region DA (see FIG. 1A) and the non-display region NDA (see FIG. 1A) of the electronic device ED. As used herein, the phrase "a region/portion corresponds to a region/portion" indicates that they overlap and are not limited to the same area.

The display panel DP may include a sensing region DP-TA corresponding to the sensing region TA of FIG. 1A. The sensing region DP-TA may have a lower resolution than the display region DP-DA.

As shown in FIG. 2, a driving chip DIC may be disposed on the non-display region DP-NDA of the display panel DP. A flexible circuit board FCB may be bonded to the non-display region DP-NDA of the display panel DP. The flexible circuit board FCB may be connected to a main circuit board. The main circuit board may be one electronic component constituting the electronic module EM.

The driving chip DIC may include driving elements, for example, a data driving circuit, for driving pixels of the display panel DP. FIG. 2 shows a structure in which the driving chip DIC is mounted on the display panel DP, but the embodiment of the inventive concept is not limited thereto. For example, the driving chip DIC may be mounted on the flexible circuit board FCB.

The electronic module EM may be disposed in each of a first housing HM1 and a second housing HM2, and the power module PSM may be disposed in each of a first housing HM1 and a second housing HM2. Although not shown, the electronic module EM disposed in the first housing HM1 and the electronic module EM disposed in the second housing HM2 may be electrically connected through a flexible circuit board.

The housing HM is bonded to the display device DD, particularly the window module WM, to accommodate the other modules. The housing HM is shown to include first and second housings HM1 and HM2 which are separated, but is not limited thereto. Although not shown, the electronic device ED may further include a hinge structure configured to connect the first and second housings HM1 and HM2.

Figure 3:
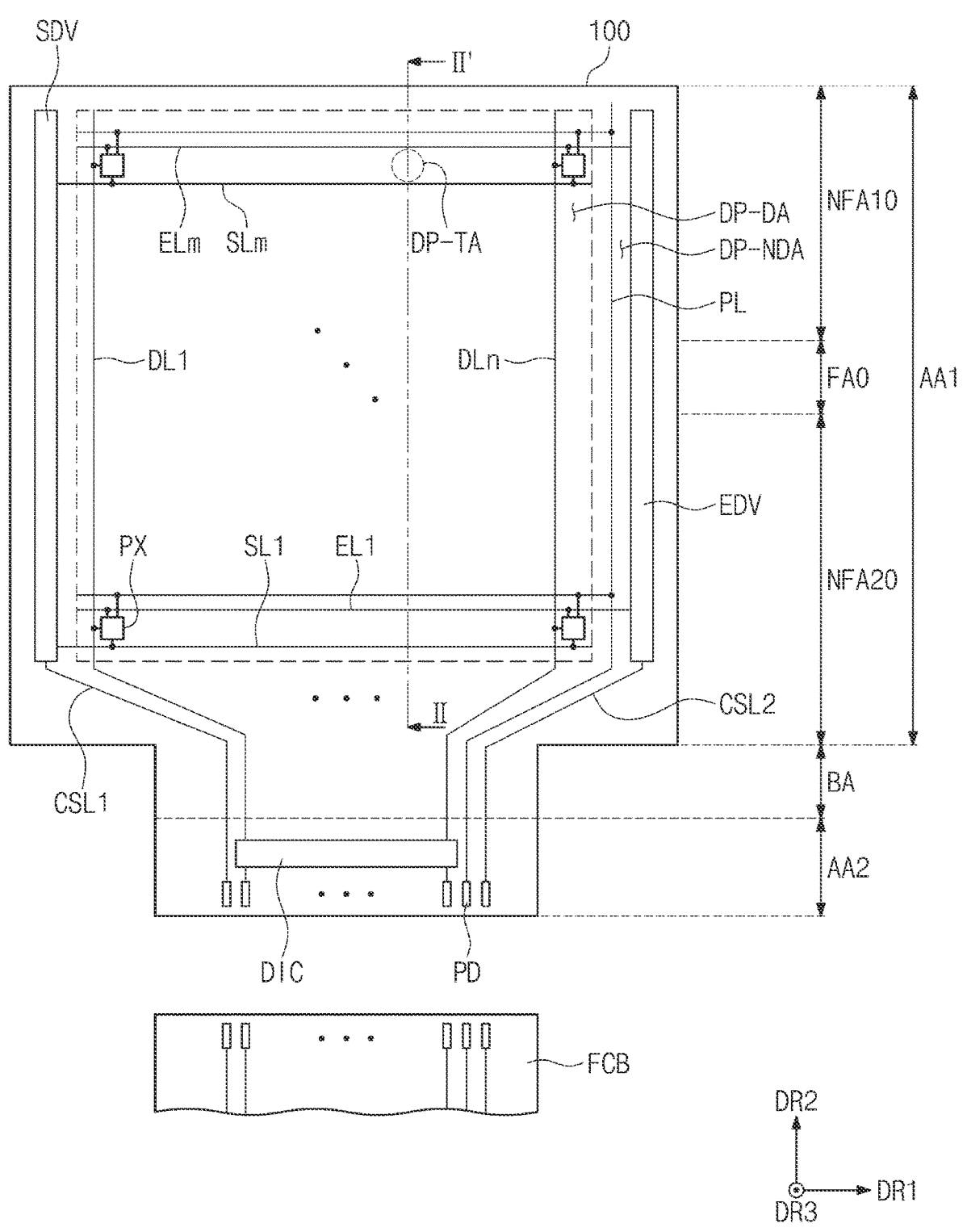
FIG. 3 is a plan view of a display panel according to an embodiment of the inventive concept.

FIG. 3 is a plan view of a display panel DP according to an embodiment of the inventive concept.

Referring to FIG. 3, the display panel DP may include a display region DP-DA and a non-display region DP-NDA around the display region DP-DA. The display region DP-DA and the non-display region DP-NDA are distinguished by the presence of a pixel PX. The pixel PX is disposed in the display region DP-DA. A scan driver SDV, a data driver, and a light emitting driver EDV may be disposed in the non-display region DP-NDA. The data driver may be some circuits configured in the driving chip DIC shown in FIG. 3.

The display panel DP includes a first region AA1, a second region AA2, and a bending region BA, which are separated from each other in the second direction DR2. The second region AA2 and the bending region BA may be a partial region of the non-display region DP-NDA. The bending region BA may be disposed between the first region AA1 and the second region AA2.

The first region AA1 is a portion corresponding to the display surface DS of FIG. 1A. The first region AA1 may include a first non-folding region NFA10, a second non-folding region NFA20, and a folding region FA0. The first non-folding region NFA10, the second non-folding region NFA20, and the folding region FA0 correspond to the first non-folding region NFA1, the second non-folding region NFA2, and the folding region FA of FIGS. 1A to 1C, respectively.

A length of the bending region BA and a length of the second region AA2 may be smaller than a length of the first region AA1 in the first direction DR1. A region having a smaller length in the direction of a bending axis may be bent more easily.

The display panel DP may include a plurality of pixels PX, a plurality of scan lines SL1 to SLm, a plurality of data lines DL1 to DLn, a plurality of light emitting lines EL1 to ELm, first and second control lines CSL1 and CSL2, a power line PL, and a plurality of pads PD. In this case, m and n are natural numbers. The pixels PX may be connected to the scan lines SL1 to SLm, the data lines DL1 to DLn, and the emission lines EL1 to ELm.

The scan lines SL1 to SLm may extend in the first direction DR1 and be connected to the scan driver SDV. The data lines DL1 to DLn may extend in the second direction DR2, and be connected to the driving chip DIC via the bending region BA. The light emitting lines EL1 to ELm may extend in the first direction DR1 and be connected to the light emitting driver EDV.

The power line PL may include a portion extending in the second direction DR2 and a portion extending in the first direction DR1. The portion extending in the first direction DR1 and the portion extending in the second direction DR2 may be disposed on different layers. A portion of the power line PL, which extends in the second direction DR2, may extend to the second region AA2 via the being region BA. The power line PL may provide a first voltage to the pixels PX.

The first control line CSL1 may be connected to the scan driver SDV, and may extend toward a lower end of the second region AA2 via the bending region BA. The second control line CSL2 may be connected to the light emitting driver EDV, and may extend toward a lower end of the second region AA2 via the bending region BA.

When viewed on a plane, the pads PD may be disposed adjacent to the lower end of the second region AA2. The driving chip DIC, the power line PL, the first control line CSL1, and the second control line CSL2 may be connected to the pads PD. The flexible circuit board FCB may be electrically connected to the pads PD through an anisotropic conductive adhesive layer.

The sensing region DP-TA may have a lower resolution within a reference area than the display region DP-DA. A smaller number of pixels may be disposed in the sensing region DP-TA within the reference area (or the same area) than in the display region DP-DA.

Figure 4:
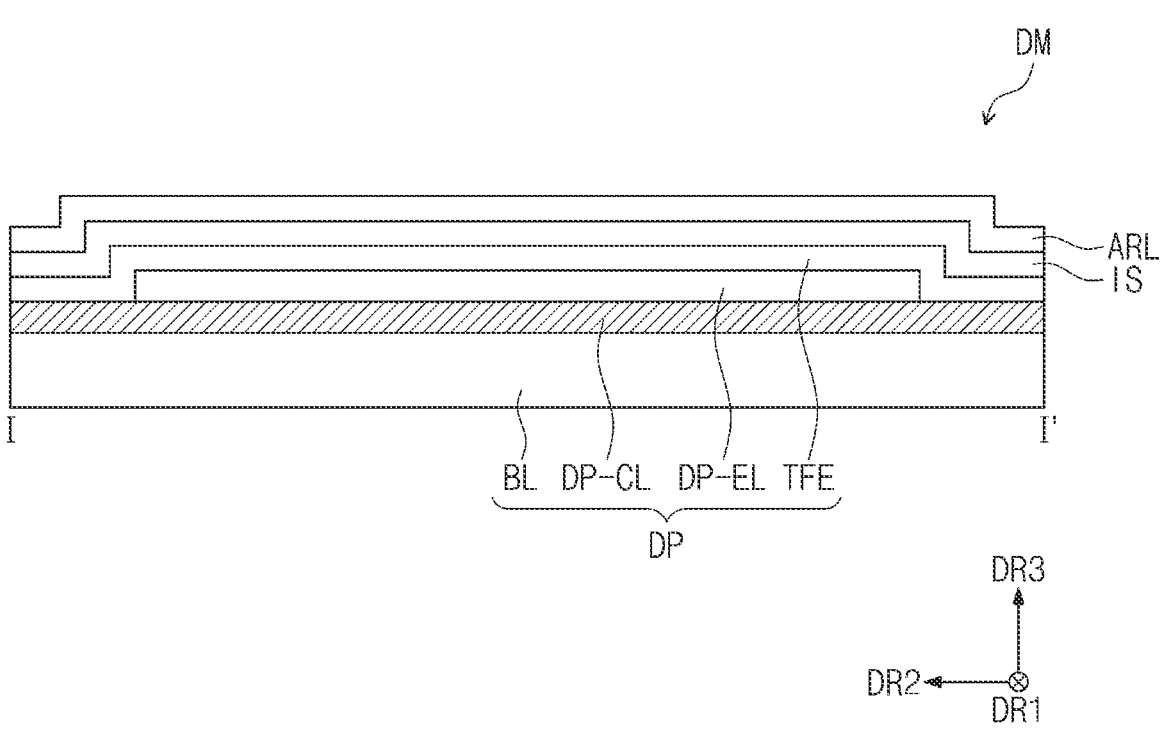
FIG. 4 is a cross-sectional view of a display module according to an embodiment of the inventive concept.

FIG. 4 is a cross-sectional view of a display module DM according to an embodiment of the inventive concept.

Referring to FIG. 4, the display module DM may include a display panel DP, an input sensor IS, and an antireflection layer ARL. The display panel DP may include a base layer BL, a circuit layer DP-CL, a light emitting element layer DP-EL, and an encapsulation layer TFE.

The base layer BL may provide a base surface on which the circuit layer DP-CL is disposed. The base layer BL may be a flexible substrate that is bendable, foldable, rollable, or the like. The base layer BL may be a glass substrate, a metal substrate, or a polymer substrate. However, the embodiment of the inventive concept is not limited thereto, and the base layer BL may be an inorganic layer, an organic layer, or a composite material layer.

The base layer BL may have a multi-layered structure. For example, the base layer BL may include a first synthetic resin layer, a multi- or single-layered inorganic layer, and a second synthetic resin layer disposed on the multi- or single-layered inorganic layer. The first and second synthetic resin layers each may include a polyimide-based resin, and is not particularly limited.

The circuit layer DP-CL may be disposed on the base layer BL. The circuit layer DP-CL may include an insulating layer, a semiconductor pattern, a conductive pattern, a signal line, and the like.

The light emitting element layer DP-EL may be disposed on the circuit layer DP-CL. The light emitting element layer DP-EL may include a light emitting element. For example, the light emitting element may include organic light emitting materials, inorganic light emitting materials, organic-inorganic light emitting materials, quantum dots, quantum rods, micro LEDs, or nano LEDs.

The encapsulation layer TFE may be disposed on the light emitting element layer DP-EL. The encapsulation layer TFE may serve to protect the light emitting element layer DP-EL from moisture, oxygen, and foreign substances such as dust particles. The encapsulation layer may include at least one inorganic layer. The encapsulation layer TFE may include a stack structure of an inorganic layer/an organic layer/an inorganic layer.

The input sensor IS may be directly disposed on the display panel DP. The display panel DP and the input sensor IS may be formed through a roll-to-roll process. "Being directly disposed" as described herein may indicate that a third component is not disposed between the input sensor IS and the display panel DP. That is, a separate adhesive layer may not be disposed between the input sensor IS and the display panel DP.

The antireflection layer ARL may be directly disposed on the input sensor IS. The antireflection layer ARL may reduce reflectance of external light incident from the outside of the display device DD. The antireflection layer ARL may include color filters. The color filters may have a predetermined arrangement. For example, the color filters may be arranged in consideration of light emitting colors of pixels included in the display panel DP. In addition, the antireflection layer ARL may further include a black matrix adjacent to the color filters.

In an embodiment of the inventive concept, the positions of the input sensor IS and the antireflection layer ARL may be reversed. In an embodiment of the inventive concept, the antireflection layer ARL may be replaced with a polarizing film. The polarizing film may be bonded to the input sensor IS through an adhesive layer.

Figure 5:
FIG. 5 is a cross-sectional view of a portion of a display module according to an embodiment of the inventive concept.

FIG. 5 is a cross-sectional view of a portion of a display module DM according to an embodiment of the inventive concept. FIG. 5 shows components corresponding to one pixel of the display module DM according to an embodiment of the inventive concept in more detail.

Referring to FIG. 5, the display region DP-DA may include a light emitting region LA and a non-light emitting region NLA. The light emitting region LA may be defined as a region where a first electrode AE of a light emitting element LD is exposed from a pixel defining film PDL. The light emitting region LA may overlap the light emitting element LD. The non-light emitting region NLA may be disposed between the light emitting regions LA in the display region DP-DA. Each of the first non-folding region NFA10, the second non-folding region NFA20, and the folding region FA0 of FIG. 3 may include the light emitting regions LA in which the light emitting elements LD each overlap, and a non-light emitting region NLA disposed between the light emitting regions LA.

FIG. 5 shows one light emitting element LD, and a silicon transistor S-TFT and an oxide transistor O-TFT of a pixel circuit. At least one of a plurality of transistors included in the pixel circuit may be an oxide transistor O-TFT, and the remaining transistors may each be a silicon transistor S-TFT.

A buffer layer BFL may be disposed on the base layer BL. The buffer layer BFL may prevent diffusion of metal atoms or impurities from the base layer BL into an upper first semiconductor pattern SP1. The first semiconductor pattern SP1 includes an active region AC1 of the silicon transistor S-TFT. In addition, the buffer layer BFL may control a heat supply rate upon a crystallization process for forming the first semiconductor pattern SP1, and the first semiconductor pattern SP1 may thus be uniformly formed.

A first rear metal layer BMLa may be disposed below the silicon transistor S-TFT, and a second rear metal layer BMLb may be disposed below the oxide transistor O-TFT. The first and second rear metal layers BMLa and BMLb may be disposed to overlap the pixel circuit. The first and second rear metal layers BMLa and BMLb may block external light from reaching the pixel circuit.

The first rear metal layer BMLa may be disposed to correspond to at least a portion of the pixel circuit. The first rear metal layer BMLa may be disposed to overlap a driving transistor implemented as a silicon transistor S-TFT.

The first rear metal layer BMLa may be disposed between the base layer BL and the buffer layer BFL. In an embodiment of the inventive concept, an inorganic barrier layer may be further disposed between the first rear metal layer BMLa and the buffer layer BFL. The first rear metal layer BMLa may be connected to an electrode or a wiring and may receive a constant voltage or a signal therefrom. According to an embodiment of the inventive concept, the first rear metal layer BMLa may be a floating electrode isolated from other electrodes or wirings.

The second rear metal layer BMLb may be disposed to correspond to a lower portion of the oxide transistor O-TFT. The second rear metal layer BMLb may be disposed between a second insulating layer IL2 and a third insulating layer IL3. The second rear metal layer BMLb may be disposed on the same layer as a second electrode CE20 of a storage capacitor Cst. The second rear metal layer BMLb may be connected to a contact electrode BML2-C to receive a constant voltage or a signal. The contact electrode BML2-C may be disposed on the same layer as a gate GT2 of the oxide transistor O-TFT.

The first rear metal layer BMLa and the second rear metal layer BMLb may each include a reflective metal. For example, the first rear metal layer BMLa and the second rear metal layer BMLb may each include silver (Ag), silver-containing alloy, molybdenum (Mo), molybdenum-containing alloy, aluminum (Al), aluminum-containing alloy, aluminum nitride (AlN), tungsten (W), tungsten nitride (WN), copper (Cu), and p+ doped amorphous silicon. The first rear metal layer BMLa and the second rear metal layer BMLb may include the same material or different materials.

Although not shown separately, according to an embodiment of the inventive concept, the second rear metal layer BMLb may be omitted. The first rear metal layer BMLa may extend to a lower portion of the oxide transistor O-TFT, and the first rear metal layer BMLa may thus block light incident to the lower portion of the oxide transistor O-TFT.

The first semiconductor pattern SP1 may be disposed on the buffer layer BFL. The first semiconductor pattern SP1 may include a silicon semiconductor. For example, the silicon semiconductor may include amorphous silicon, polycrystalline silicon, or the like. For example, the first semiconductor pattern SP1 may include low-temperature polysilicon.

FIG. 5 shows only a portion of the first semiconductor pattern SP1 disposed on the buffer layer BFL, and the first semiconductor pattern SP1 may be further disposed in another region. The first semiconductor pattern SP1 may be arranged in a specific rule across the pixels. The first semiconductor pattern SP1 may have different electrical properties according to with/without doping. The first semiconductor pattern SP1 may include a first region having high conductivity and a second region having low conductivity. The first region may be doped with an N-type dopant or a P-type dopant. A P-type transistor may include a doped region doped with the P-type dopant, and a N-type transistor may include a doped region doped with the N-type dopant. The second region may be a non-doped region or may be doped in a lower concentration than the first region.

The first region has greater conductivity than the second region, and may substantially serve as an electrode or a signal line. The second region may substantially correspond to an active region (or a channel) of the transistor. That is, a portion of the first semiconductor pattern SP1 may be an active region of the transistor, another portion may be a source or drain of the transistor, and the other portion may be a connection electrode or a connection signal line.

A source region SE1 (or a source), an active region AC1 (or a channel), and a drain region DE1 (or a drain) of the silicon transistor S-TFT may be formed from the first semiconductor pattern SP1. The source region SE1 and the drain region DE1 may extend in opposite directions from the active region AC1 on a cross section.

A first insulating layer IL1 may be disposed on the buffer layer BFL. The first insulating layer IL1 may commonly overlap a plurality of pixels and cover the first semiconductor pattern SP1. The first insulating layer IL1 may be an inorganic layer or an organic layer, and have a single-layered or multi-layered structure. The first insulating layer IL1 may include at least one among aluminum oxide, titanium oxide, silicon oxide, silicon nitride, silicon oxynitride, zirconium oxide, and hafnium oxide. In the present embodiment, the first insulating layer IL1 may be a single-layered silicon oxide layer. Insulating layers of the circuit layer DP-CL which will be described later in addition to the first insulating layer IL1 may be inorganic layers or organic layers, and have single-layered or multi-layered structures. The inorganic layer may include at least one of the materials described above, but is not limited thereto.

The gate GT1 of the silicon transistor S-TFT is disposed on the first insulating layer IL1. The gate GT1 may be a portion of a metal pattern. The gate GT1 overlaps the active region AC1. In the process of doping the first semiconductor pattern SP1, the gate GT1 may function as a mask. The gate GT1 may include titanium (Ti), silver (Ag), silver-containing alloy, molybdenum (Mo), molybdenum-containing alloy, aluminum (Al), aluminum-containing alloy, aluminum nitride (AlN), tungsten (W), tungsten nitride (WN), copper (Cu), indium tin oxide (ITO), indium zinc oxide (IZO), and the like, but is not particularly limited thereto.

The second insulating layer IL2 may be disposed on the first insulating layer IL1 and may cover the gate GT1. The third insulating layer IL3 may be disposed on the second insulating layer IL2. The second electrode CE20 of the storage capacitor Cst may be disposed between the second insulating layer IL2 and the first insulating layer IL3. In addition, the first electrode CE10 of the storage capacitor Cst may be disposed between the first insulating layer IL1 and the second insulating layer IL2.

A second semiconductor pattern SP2 may be disposed on the third insulating layer IL3. The second semiconductor pattern SP2 may include an active region AC2 of the oxide transistor O-TFT, which will be described later. The second semiconductor pattern SP2 may include an oxide semiconductor. The second semiconductor pattern SP2 may include a transparent conductive oxide such as indium tin oxide (ITO), indium zinc oxide (IZO), indium gallium zinc oxide (IGZO), zinc oxide (ZnO), or indium oxide (In2O3).

The oxide semiconductor may include a plurality of regions divided according to whether transparent conductive oxides are reduced. A region in which the transparent conductive oxide is reduced (hereinafter, reduction region) has greater conductivity than a region in which the transparent conductive oxide is not reduced (hereinafter, non-reduction region). The reduction region substantially serves as a source/drain or signal line of transistors. The non-reduction region substantially corresponds to a semiconductor region (or active region or channel) of transistors. In other words, a portion of the second semiconductor pattern SP2 may be a semiconductor region of transistors, another partial region may be a source region/drain region of transistors, and the other region may be a signal transmission region.

A source region SE2 (or a source), an active region AC2 (or a channel), and a drain region DE2 (or a drain) of the oxide transistor O-TFT may be formed from the second semiconductor pattern SP2. The source region SE2 and the drain region DE2 may extend in opposite directions from the active region AC2 on a cross section.

The fourth insulating layer IL4 may be disposed on the third insulating layer IL3. As shown in FIG. 5, the fourth insulating layer IL4 may be an insulation pattern overlapping the gate GT2 of the oxide transistor O-TFT and be exposed by the source region SE2 and the drain region DE2 of the oxide transistor O-TFT. As shown in FIG. 5, the fourth insulating layer IL4 may at least partially cover the second semiconductor pattern SP2.

As shown in FIG. 5, the gate GT2 of the oxide transistor O-TFT is disposed on the fourth insulating layer IL4. The gate GT2 of the oxide transistor O-TFT may be a portion of a metal pattern. The gate GT2 of the oxide transistor O-TFT overlaps the active region AC2.

A fifth insulating layer IL5 may be disposed on the fourth insulating layer 40 and may cover the gate GT2. A first connection electrode CNE1 may be disposed on the fifth insulating layer IL5. The first connection electrode CNE1 may be connected to drain region DE1 of the silicon transistor S-TFT through a contact hole passing through the first to third and fifth insulating layers IL1, IL2, IL3, and IL5.

A sixth insulating layer IL6 may be disposed on the fifth insulating layer IL5. A second connection electrode CNE2 may be disposed on the sixth insulating layer IL6. The second electrode CNE2 may be connected to the first connection electrode CNE1 through a contact hole passing through the sixth insulating layer IL6. A seventh insulating layer IL7 may be disposed on the sixth insulating layer IL6 and may at least partially cover the second connection electrode CNE2. An eighth insulating layer IL8 may be disposed on the seventh insulating layer IL7.

The sixth insulating layer IL6, the seventh insulating layer IL7, and the eighth insulating layer IL8 may each be an organic layer. For example, the sixth insulating layer IL6, the seventh insulating layer IL7, and the eighth insulating layer IL8 may each include benzocyclobutene (BCB), polyimide, hexamethyldisiloxane (HMDSO), general polymers such as polymethylmethacrylate (PMMA) or polystyrene (PS), a polymer derivative having a phenolic group, an acrylic polymer, an imide-based polymer, an aryl ether polymer, an amide-based polymer, a fluorine-based polymer, a p-xylene-based polymer, a vinyl alcohol polymer, and a blend thereof.

The light emitting element LD may include a first electrode AE, an emission layer EL, and a second electrode CE.

The second electrode CE may be provided in common on a plurality of light emitting elements.

The first electrode AE of the light emitting element LD may be disposed on the eighth insulating layer IL8. The first electrode AE of the light emitting element LD may be a (semi)light-transmitting electrode or a reflective electrode. In an embodiment of the inventive concept, the first electrode AE of the light emitting element LD may each include a reflective layer formed of Ag, Mg, Al, Pt, Pd, Au, Ni, Nd, Ir, Cr, or a compound thereof, and a transparent or semi-transparent electrode layer formed on the reflective layer The transparent or semi-transparent electrode may include at least one selected from the group consisting of indium tin oxide (ITO), indium zinc oxide (IZO), indium gallium zinc oxide (IGZO), zinc oxide (ZnO) or indium oxide (In2O3), and aluminum-doped zinc oxide (AZO). For example, the first electrode AE of the light emitting element LD may include a stacked structure of ITO/Ag/ITO.

The pixel defining film PDL may be disposed on the eighth insulating film IL8. The pixel defining film PDL may have light absorption properties, and for example, the pixel defining film PDL may be black in color. The pixel defining film PDL may include a black coloring agent. The black coloring agent may include a black dye and a black pigment. The black coloring agent may include carbon black, a metal such as chromium, or an oxide thereof. The pixel defining film PDL may correspond to a light blocking pattern having light blocking properties.

The pixel defining film PDL may cover a portion of the first electrode AE of the light emitting element LD. For example, an opening PDL-OP exposing a portion of the first electrode AE of the light emitting element LD may be defined in the pixel defining film PDL. The pixel defining film PDL may increase the distance between an edge of the first electrode AE and the second electrode CE in the light emitting element LD. Accordingly, the pixel defining film PDL may serve to prevent an arc from being caused at the edge of the first electrode AE.

Although not shown, a hole control layer may be disposed between the first electrode AE and the emission layer EL. The hole control layer may include a hole transport layer, and may further include a hole injection layer. An electron control layer may be disposed between the emission layer EL and the second electrode CE. The electron control layer may include an electron transport layer, and may further include an electron injection layer. The hole control layer and the electron control layer may be commonly formed in a plurality of pixels PX (see FIG. 3) using an open mask.

The encapsulation layer TFE may be disposed on the light emitting element layer DP-EL. The encapsulation layer TFE may include an inorganic layer TFE1, an organic layer TFE2, and an inorganic layer TFE3 which are sequentially stacked, but the layers forming the encapsulation layer TFE are not limited thereto.

The inorganic layers TFE1 and TFE3 may protect the light emitting element layer DP-EL from moisture and oxygen, and the organic layer TFE2 may protect the light emitting element layer DP-EL from foreign substances such as dust particles. The inorganic layers TFE1 and TFE3 may include a silicon nitride layer, a silicon oxy nitride layer, a silicon oxide layer, a titanium oxide layer, or an aluminum oxide layer. The organic layer TFE2 may include an acryl-based organic layer, but the embodiment of the inventive concept is not limited thereto.

The input sensor IS may be disposed on the display panel DP. The input sensor IS may be referred to as a sensor, an input sensing layer, or an input sensing panel. The input sensor IS may include a sensor base layer 210, a first conductive layer 220, a sensing insulating layer 230, and a second conductive layer 240.

The sensor base layer 210 may be directly disposed on the display panel DP. The sensor base layer 210 may be an inorganic layer including at least any one among silicon nitride, silicon oxynitride, and silicon oxide. Alternatively, the sensor base layer 210 may be an organic layer including an epoxy resin, an acrylic resin, or an imide-based resin. The sensor base layer 210 may have a single layer structure or may have a multilayer structure stacked along the third direction DR3.

The first conductive layer 220 and the second conductive layer 240 each may have a single-layer structure or may have a multi-layer structure stacked along the third direction DR3. The first conductive layer 220 and the second conductive layer 240 may include conductive lines that define a sensing electrode in the form of a mesh. The conductive lines may non-overlap the opening PDL-OP and may overlap the pixel defining film PDL.

The single-layered conductive layer may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), or indium zinc tin oxide (IZTO). In addition, the transparent conductive layer may include a conductive polymer such as PEDOT, a metal nanowire, graphene, and the like.

The conductive layer having a multi-layered structure may include metal layers which are sequentially staked. The metal layers may have a three-layer structure of, for example, titanium/aluminum/titanium. The multi-layered conductive layer may include at least one metal layer and at least one transparent conductive layer.

The sensing insulating layer 230 may be disposed between the first conductive layer 220 and the second conductive layer 240. The sensing insulating layer 230 may include an inorganic film. The inorganic film may include at least one among aluminum oxide, titanium oxide, silicon oxide, silicon nitride, silicon oxynitride, zirconium oxide, and hafnium oxide.

Alternately, the sensing insulating layer 230 may include an organic film. The organic film may include at least any one of an acrylic-based resin, a methacrylate-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

The antireflection layer ARL may be disposed on the input sensor IS. The antireflection layer ARL may include a partition layer 310, a plurality of color filters 320, and a planarization layer 330.

A material constituting the partition layer 310 is not particularly limited as long as the material absorbs light. The partition layer 310 is a layer which is black in color, and in an embodiment, the partition layer 310 may include a black coloring agent. The black coloring agent may include a black dye and a black pigment. The black coloring agent may include carbon black, a metal such as chromium, or an oxide thereof.

The partition layer 310 may cover the second conductive layer 240 of the input sensor IS. The partition layer 310 may prevent reflection of external light by the second conductive layer 240. In a partial region of the display module DM, the partition layer 310 may be omitted. A region where the partition layer 310 is omitted and is not arranged may have a higher transmittance than other regions.

An opening 310-OP may be defined in the partition layer 310. The opening 310-OP may overlap the first electrode AE of the light emitting element LD. Any one of the plurality of color filters 320 may overlap the first electrode AE of the light emitting element LD. Any one of the plurality of color filters 320 may cover the opening 310-OP. Each of the plurality of color filters 320 may contact the partition layer 310.

The planarization layer 330 may cover the partition layer 310 and the plurality of color filters 320. The planarization layer 330 may include an organic material, and may provide a flat surface on an upper surface of the planarization layer 330. In an embodiment of the inventive concept, a planarization layer 330 may be omitted.

Figure 6:
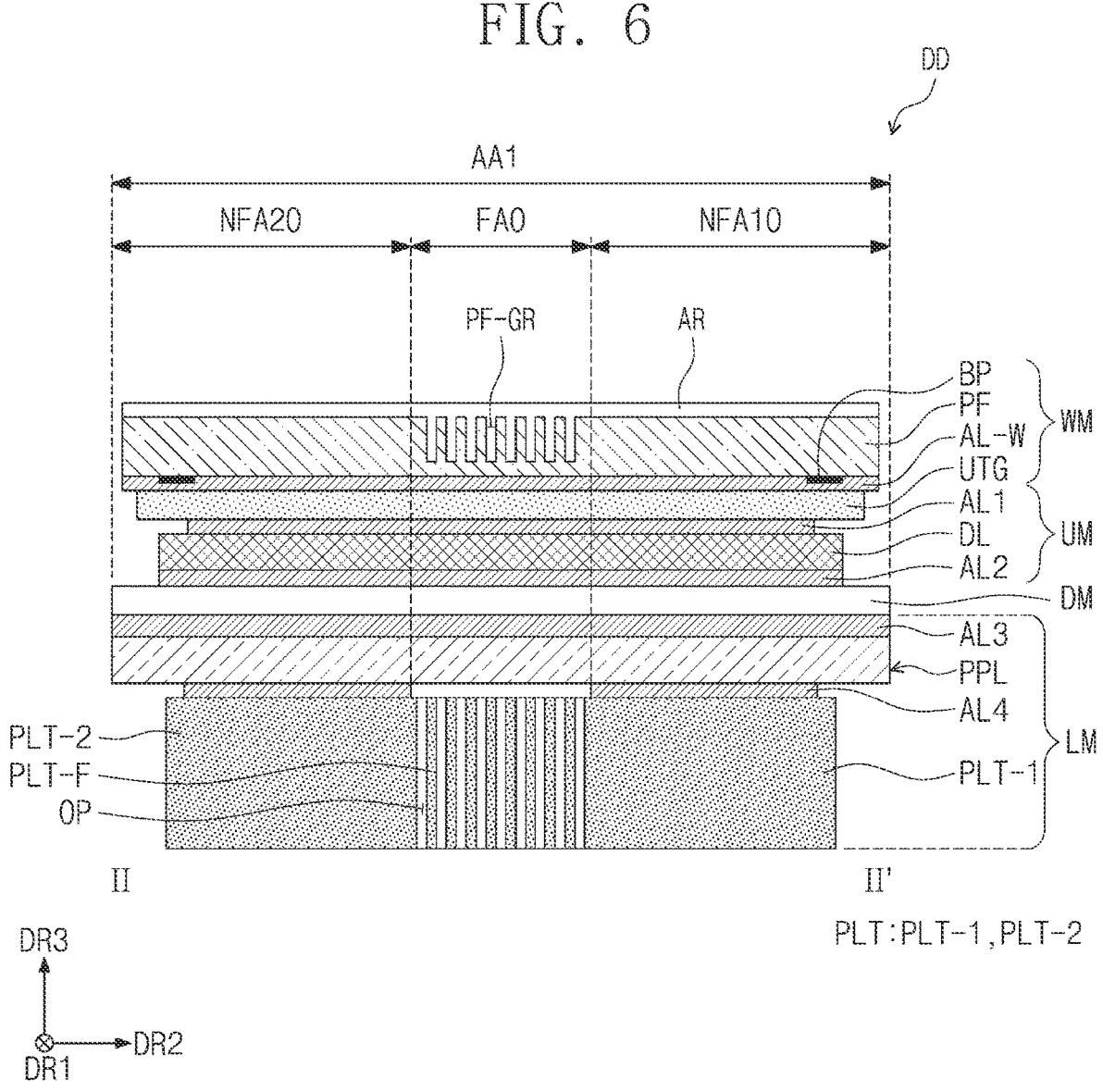
FIG. 6 is a cross-sectional view of a display device according to an embodiment of the inventive concept.

FIG. 6 is a cross-sectional view of a display device DD according to an embodiment of the inventive concept.

FIG. 6 shows an unfolded state in which the display module DM is not bent. In FIG. 6, regions separating the display module DM are shown with respect to the display panel DP of FIG. 3.

Referring to FIG. 6, the display device DD may include a window module WM, an upper member UM, a display module DM, and a lower member LM. The upper member UM may collectively refer to a component disposed between the window module WM and the display module DM, and the lower member LM may collectively refer to a component disposed below the display module DM.

The window module WM may be disposed on the display module DM. The window module WM may include a window UTG (or a thin glass substrate), a window protection layer PF disposed on the window UTG, a bezel pattern BP disposed on a lower surface of the window protection layer PF, and an upper protection layer AR disposed on the window protection layer PF. The window module WM may include a window adhesive layer AL-W bonding the window protection layer PF and the window UTG.

The bezel pattern BP may overlap the non-display region NDA shown in FIG. 1A. The bezel pattern BP may be disposed on one surface of the window UTG or one surface of the window protection layer PF. FIG. 6 shows, as an example, the bezel pattern BP disposed on a lower surface of the window protection layer PF. The embodiment of the inventive concept is not limited thereto, and the bezel pattern BP may be disposed on an upper surface of the window protection layer PF. The bezel pattern BP may include a base material and a dye or a pigment mixed with the base material.

The window UTG may have a thickness of about 15 μm to about 45 μm. The window UTG may have a thickness of, for example, about 30 μm. The window UTG may be a chemically strengthened glass substrate. The window UTG may minimize generation of wrinkles even when folding and unfolding are repeated.

At least one groove PF-GR overlapping the folding region FA0 may be defined in the window protection layer PF. As the groove PF-GR is defined in the window protection layer PF, even when the window protection layer PF is thicker, folding is available and stress resulting from the folding may be reduced.

The window protection layer PF may be a synthetic resin film. The window protection layer PF may include polyimide, polycarbonate, polyamide, triacetylcellulose, polymethylmethacrylate, or polyethylene terephthalate.

The window adhesive layer AL-W may be a pressure sensitive adhesive film (PSA) or an optically clear adhesive (OCA). Adhesive layers which will be described below may also include the same adhesive as the window adhesive layer AL-W.

The window adhesive layer AL-W may be separated from the window UTG. The window protection layer PF has a lower strength than the window UTG, thereby having a relatively greater chance of scratches. After the window adhesive layer AL-W and the window protection layer PF are separated, a new window protection layer PF may be bonded to the window UTG.

An upper protection layer AR may be disposed on the window protection layer PF to fill the groove PF-GR. The upper protection layer AR may fill an upper surface of the stepped window protection layer PF by the groove PF-GR and provide a flat upper surface. The upper protection layer AR may have the same refractive index as the window protection layer PF. Accordingly, users may not view the groove PF-GR defined in the window protection layer PF from the outside. The upper protection layer AR may be made of resin having the same refractive index as that of the window protection layer PF. Although not shown separately, at least one of a hard coating layer, an anti-fingerprint layer, or an antireflection layer may be disposed on the upper protection layer AR.

The upper member UM may include an upper film DL. The upper film DL may include a synthetic resin film. The synthetic resin film may include polyimide, polycarbonate, polyamide, triacetylcellulose, polymethylmethacrylate, or polyethylene terephthalate.

The upper film DL may absorb external shocks applied to a front surface of the display device DD. As shown in FIG. 5, the display module DM of an embodiment may include a structure of the antireflection layer ARL, which includes a plurality of color filters 320 in place of a polarizing film, and accordingly, the display device DD may have reduced front impact strength. The upper film DL may compensate for the reduced impact strength by applying the antireflection layer ARL including the color filter 320. In an embodiment of the inventive concept, the upper film DL may be omitted.

The upper member UM may include a first adhesive layer AL1 bonding the upper film DL and the window module WM, and a second adhesive layer AL2 bonding the upper film DL and the display module DM. The first adhesive layer AL1 and the second adhesive layer AL2 may each include a pressure sensitive adhesive film (PSA) or an optically clear adhesive (OCA). For example, the first adhesive layer AL1 and the second adhesive layer AL2 may each include a pressure sensitive adhesive film.

In the display device DD according to an embodiment, the first adhesive layer AL1 may have a predetermined thickness or greater. The first adhesive layer AL1 may have a thickness of, for example, about 75 µm or greater. The first adhesive layer AL1 may have a thickness of about 75 µm to about 100 µm. In the display device DD of an embodiment, the first adhesive layer AL1 bonding the window UTG and the upper film DL is provided to have a thickness of about 75 µm or greater, so that the display device DD may have improved mechanical strength. Accordingly, the display module DM may be prevented from being damaged due to external impact. Meanwhile, when the first adhesive layer AL1 has a thickness of greater than 100 µm, the display device DD has an excessive increase in thickness, and may thus have degradation in folding properties.

The lower member LM may include a lower protection film PPL, a first support layer PLT, a third adhesive layer AL3, and a fourth adhesive layer AL4. The third adhesive layer AL3 and the fourth adhesive layer AL4 may include an adhesive such as a pressure sensitive adhesive or an optically transparent adhesive. In an embodiment of the inventive concept, some of the above-described components may be omitted.

The lower protection film PPL may be disposed below the display module DM. The lower protection film PPL may protect a lower portion of the display module DM. The lower protection film PPL may include a flexible synthetic resin film. For example, the lower protection film PPL may include polyethylene terephthalate.

The third adhesive layer AL3 may bond the lower protection film PPL and the display module DM. The sum of the thicknesses of the third adhesive layer AL3, the lower protection film PPL, and the display module DM may be about 90 µm to about 120 µm. For example, the sum of thicknesses of the display module DM, the third adhesive layer AL3, and the lower protection film PPL may be about 105 µm.

The lower protection film PPL may be disposed below the base layer BL of the display panel DP described above with reference to FIGS. 4 and 5. In an embodiment of the inventive concept, the third adhesive layer AL3 may be directly disposed below the base layer BL of the display panel DP, and the lower protection film PPL may be directly disposed below the third adhesive layer AL3.

The fourth adhesive layer AL4 may bond the lower protection film PPL and the first support layer PLT. The fourth adhesive layer AL4 may have a thickness of about 10 µm to about 20 µm. For example, the fourth adhesive layer AL4 may have a thickness of about 16 µm. The fourth adhesive layer AL4 may be directly disposed below the lower protection film PPL, and the first support layer PLT may be directly disposed below the fourth adhesive layer AL4. That is, the first support layer PLT may be directly bonded below the lower protection film PPL through the fourth adhesive layer AL4, and other components may not be disposed therebetween.

In the display device DD according to an embodiment of the inventive concept, no components other than the fourth adhesive layer AL4 are disposed between the lower protection film PPL and the first support layer PLT disposed below the display module DM, and accordingly, the repulsive force resulting from the folding operation may be reduced.

Meanwhile, when a barrier film such as a polymer film is not disposed between the lower protection film PPL and the first support layer PLT, mechanical strength may be reduced throughout the display device DD, but in the display device DD of an embodiment of the inventive concept, the window protection layer PF is provided to be thick, and accordingly, even when a barrier film is omitted, the mechanical strength may be sufficiently secured. However, as needed, disposing a barrier film between the lower protection film PPL and the first support layer PLT is available.

The first support layer PLT may be disposed below the lower protection film PPL. The first support layer PLT may support components disposed above the first support layer PLT and keep the display device DD in an unfolded state and a folded state. The first support layer PLT may have greater strength than the lower protection film PPL. The first support layer PLT may include at least a first support portion PLT-1 corresponding to the first non-folding region NFA10 and a second support portion PLT-2 corresponding to the second non-folding region NFA20. The first support portion PLT-1 and the second support portion PLT-2 may be spaced apart in the second direction DR2.

In the present embodiment, the first support layer PLT may include a folding portion PLT-F in which a plurality of openings OP are defined. The folding portion PLT-F corresponds to the folding region FA0 and is disposed between the first support portion PLT-1 and the second support portion PLT-2. The plurality of openings OP may be arranged such that the folding region FA0 has a lattice shape when viewed on a plane. The first support portion PLT-1, the second support portion PLT-2, and the folding portion PLT-F may be formed as a single body.

The folding portion PLT-F may prevent foreign substances from penetrating into a lower portion of the central region of the lower protection film PPL opened from the first support portion PLT-1 and the second support portion PLT-2, during the folding operation shown in FIGS. 1B and 1C. Flexibility of the folding portion PLT-F may be improved through the plurality of openings OP. In addition, the fourth adhesive layer AL4 is not disposed on the folding portion PLT-F, and accordingly, the flexibility of the first support layer PLT may be improved. In an embodiment of the inventive concept, the folding portion PLT-F may be omitted. In this case, the first support layer PLT may include a first support portion PLT-1 and a second support portion PLT-2 that are spaced apart.

Although not shown, a digitizer may be disposed below the first support layer PLT. The digitizer may sense user inputs, using a magnetic field. The first support layer PLT may be selected from materials capable of transmitting the magnetic field generated from the digitizer with minimal loss. The first support layer PLT may include an insulating material.

The first support layer PLT may include a non-metal material. The first support layer PLT may include a reinforcing fiber composite material. The first support layer PLT may include reinforcing fibers disposed inside a matrix portion. The reinforcing fibers may be carbon fibers or glass fibers. The matrix portion may include a polymer resin. The matrix portion may include a thermoplastic resin. For example, the matrix portion may include a polyamide-based resin or a polypropylene-based resin. For example, the reinforcing fiber composite material may be carbon fiber reinforced plastic (CFRP) or glass fiber reinforced plastic (GFRP).

The first support layer PLT may have a thickness of about 150 μm to about 200 μm. For example, the first support layer PLT may have a thickness of about 170 μm.

Figure 7:
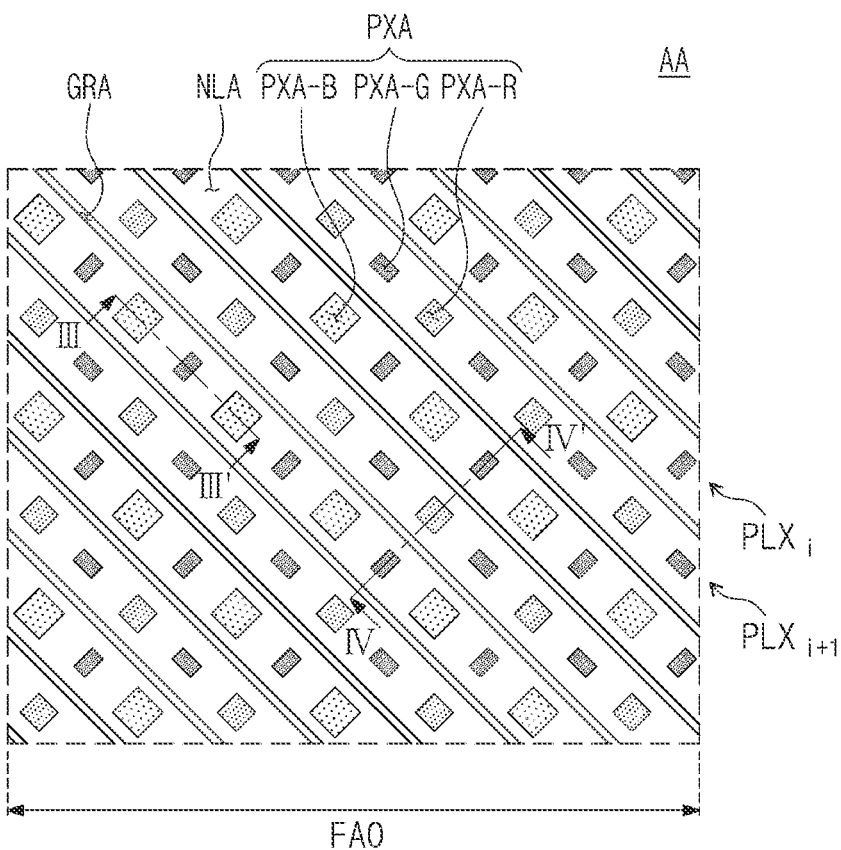
FIG. 7 is a plan view of a partial region of an electronic device according to an embodiment of the inventive concept.
Figure 7:
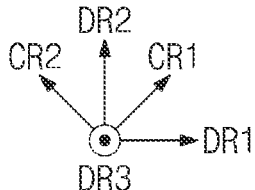

FIG. 7 is a plan view of a partial region of an electronic device ED (see FIG. 1A) according to an embodiment of the inventive concept. FIG. 7 may be a plan view enlarging region AA of FIG. 1A.

Referring to FIG. 7, a light emitting element region PXA may correspond to the light emitting region LA of FIG. 5. A groove region GRA may overlap the non-light emitting region NLA when viewed on a plane.

The light emitting element region PXA may include a first color light emitting element region PXA-B, a second color light emitting element region PXA-G, and a third color light emitting element region PXA-R. Each of the first to third color light emitting element regions PXA-B, PXA-G, and PXA-R may be a region respectively corresponding to first to third light emitting elements LD-B, LD-G, and LD-R (see FIGS. 8 and 9), which will be described later. That is, each of the first to third color light emitting element regions PXA-B, PXA-G, and PXA-R may indicate positions of each of the first to third light emitting elements LD-B, LD-G, and LD-R (see FIGS. 8 and 9).

In FIG. 7, a first oblique direction CR1 may be a direction crossing the first and second directions DR1 and DR2 when viewed on a plane formed by the first and second directions DR1 and DR2. A second oblique direction CR2 may be a direction crossing the first and second directions DR1 and DR2 when viewed on a plane formed by the first and second directions DR1 and DR2. The first oblique direction CR1 may cross the second oblique direction CR2.

The first color light emitting element region PXA-B and the second color light emitting element region PXA-G may be alternately disposed in an (i)-th light emitting element row PLXi. The (i)-th light emitting element row PLXi may extend in the second oblique direction CR2 and may be arranged adjacent to other light emitting element rows along the first oblique direction CR1. The second color light emitting element region PXA-G and the third color light emitting element region PXA-R may be alternately disposed in an (i+1)-th light emitting element row PLXi+1. The (i+1)-th light emitting element row PLXi+1 may extend in the second oblique direction CR2 and may be arranged adjacent to other light emitting element rows along the first oblique direction CR1. The (i)-th light emitting element row PLXi and the (i+1)-th light emitting element row PLXi+1 may be alternately disposed along the first oblique direction CR1.

However, the arrangement of the first to third color light emitting element regions PXA-B, PXA-G, and PXA-R is presented as an example, and as needed, the first to third color light emitting element regions PXA-B and PXA-G, and PXA-R may be altered.

The groove region GRA may overlap the non-light emitting region NLA of the folding region FA0. The groove region GRA may be a region corresponding to a groove PF-GR to be described later. The groove region GRA may be disposed between the light emitting element regions PXA-B, PXA-G, and PXA-R. The groove region GRA may be disposed between the (i)-th light emitting element row PLXi and the (i+1)-th light emitting element row PLXi+1. The groove region GRA may extend along the second oblique direction CR2.

A plurality of groove regions GRA may be provided, and intervals between mutually closest groove regions GRA may be the same. Accordingly, the stress applied to the groove PF-GR (see FIG. 9) upon folding may be equally distributed. At least one light emitting element row extending along the second oblique direction CR2 may be disposed between the mutually closest groove regions GRA. For example, the (i)-th light emitting element row PLXi or the (i+1)th light emitting element row PLXi+1 may be disposed between the mutually closest groove regions GRA. The number of light emitting element rows extending in the second oblique direction CR2, which are disposed between the mutually closest groove regions GRA may be the same.

Figure 8:
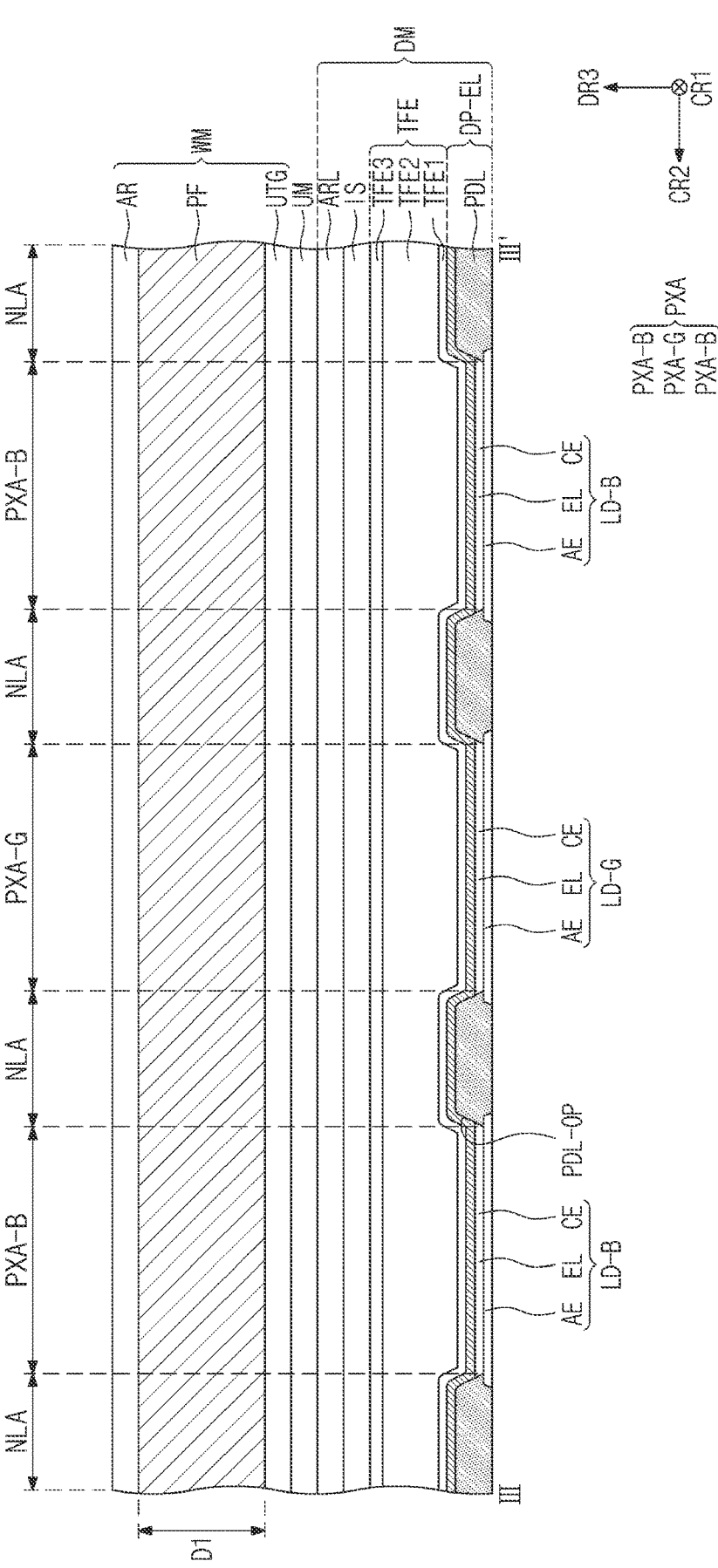
FIG. 8 is a cross-sectional view along III-III' of FIG. 7 according to an embodiment of the inventive concept.

FIG. 8 is a cross-sectional view taken along III-III' of FIG. 7 according to an embodiment of the inventive concept.

Referring to FIG. 8, cross-sections of the display module DM, the upper member UM, and the window module WM are shown. Components disposed below the display module DM are omitted. In this case, the display module DM, the upper member UM, and the window module WM may correspond to the display module DM, the upper member UM, and the window module WM of FIG. 6.

The first color light emitting element region PXA-B may correspond to a region where the first electrode AE of the first color light emitting element LD-B is exposed by the pixel defining film PDL. The second color light emitting element region PXA-G may correspond to a region where the first electrode AE of the second color light emitting element LD-G is exposed by the pixel defining film PDL.

The window protection layer PF may have a thickness D1 of about 100 μm to about 350 μm. The thickness D1 of the window protection layer PF is about 100 μm or greater, which means the window protection layer PF is thicker than typical window protection layers, and accordingly, the display device DD (see FIG. 6) may have improved impact resistance. When the thickness D1 of the window protection layer PF is greater than 350 μm, excessive force may be required when the display device DD (see FIG. 6) is folded and excessive stress may be applied to the display device DD (see FIG. 6). When the thickness D1 of the window protection layer PF is 100 μm or greater, the groove PF-GR (see FIG. 6) overlapping the folding region FA0 may be defined in the window protection layer PF to facilitate folding.

The upper protection layer AR may be directly disposed on the window protection layer PF. That is, a separate adhesive layer or the like is not disposed between the upper protection layer AR and the window protection layer PF, and a lower surface of the upper protection layer AR and an upper surface of the window protection layer PF may directly be in contact.

Figure 9:
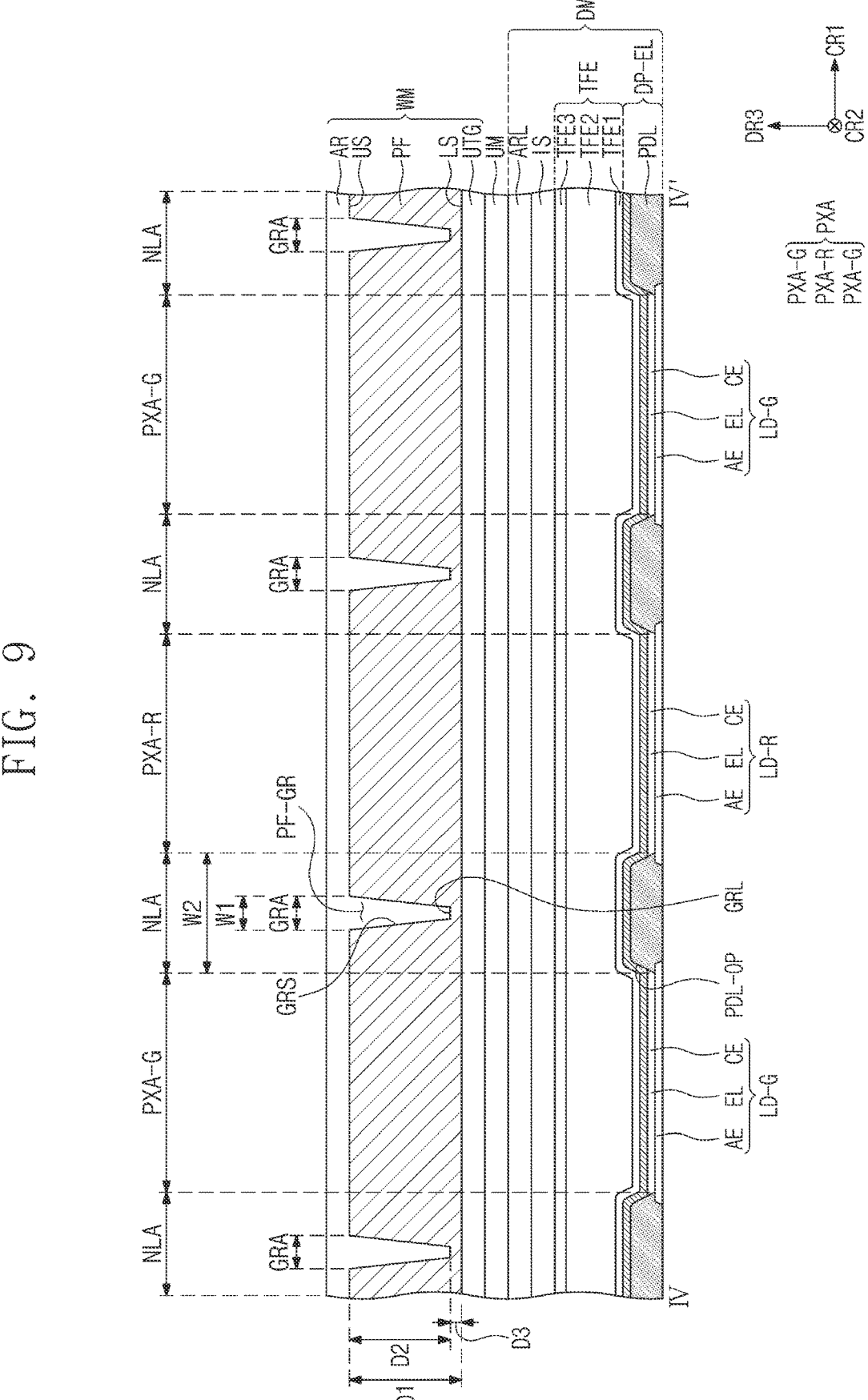
FIG. 9 is a cross-sectional view along IV-IV' of FIG. 7 according to an embodiment of the inventive concept.

FIG. 9 is a cross-sectional view taken along IV-IV' of FIG. 7 according to an embodiment of the inventive concept.

Referring to FIG. 9, cross-sections of the display module DM, the upper member UM, and the window module WM are shown. Components disposed below the display module DM are shown to be omitted. In this case, the display module DM, the upper member UM, and the window module WM may correspond to the display module DM, the upper member UM, and the window module WM of FIG. 6.

The second color light emitting element region PXA-G may correspond to a region where the first electrode AE of the second color light emitting element LD-G is exposed by the pixel defining film PDL. The third color light emitting element region PXA-R may correspond to a region where the first electrode AE of the third color light emitting element LD-R is exposed by the pixel defining film PDL.

The groove PF-GR overlapping the non-light emitting region NLA may be defined on an upper surface of the window protection layer PF. The groove PF-GR may be disposed between the second color light emitting element LD-G and the third color light emitting element LD-R when viewed on a plane. Although not shown in FIG. 9, the groove PF-GR may also be disposed between the first color light emitting element LD-B (see FIG. 8) and the second color light emitting element LD-G when viewed on a plane.

The groove PF-GR may be a groove in which a portion of the window protection layer PF is etched. The groove PF-GR may have a wedge shape that narrows in width toward the light emitting elements LD-G and LD-R. However, the shape of the groove PF-GR is not limited thereto and the groove PF-GR may have various shapes.

As such, the groove PF-GR is defined in the window protection layer PF, so that the display device DD (see FIG. 6) may be easily folded. Accordingly, the display device DD (see FIG. 6) may be foldable by increasing the thickness D1 of the window protection layer PF, and the impact resistance of the display device DD (see FIG. 6) may be improved.

The groove PF-GR may be defined by an inclined surface GRS and a lower surface GRL of the window protection layer PF. An inclination angle of the inclined surface GRS may vary as needed. For example, the inclination angle formed between the inclined surface GRS and the lower surface LS of the window protection layer PF may be 90°, and may thus have a rectangular shape with an open upper side in cross-section.

The groove PF-GR may be disposed adjacent to the center of the non-light emitting region NLA. The groove PF-GR may be spaced apart from each of the light emitting elements LD-G and LD-R by a predetermined distance. Accordingly, the groove PF-GR may be prevented from overlapping the light emitting element region PXA and being viewed by users.

Depths D2 of the groove PF-GR may all be the same. The depth D2 of the groove PF-GR may be smaller than the thickness D1 of the window protection layer PF. A difference D3 between the depth D2 of the groove PF-GR and the thickness D1 of the window protection layer PF may be about 50 μm to about 80 μm. When the difference D3 between the depth D2 of the groove PF-GR and the thickness D1 of the window protection layer PF is less than 50 μm, the window protection layer PF overlapping the groove PF-GR may be too thin to protect components disposed below the window protection layer PF. When the difference D3 between the depth D2 of the groove PF-GR and the thickness D1 of the window protection layer PF is greater than 80 μm, excessive force is required when the window protection layer PF is folded, and accordingly, an excessively large stress may be applied to the display device DD (see FIG. 6).

A width W1 of the groove PF-GR may be smaller than a distance W2 between the light emitting elements LD-G and LD-R. That is, the width W1 of the groove PF-GR may be smaller than the width W2 of the non-light emitting region NLA. Accordingly, the groove PF-GR may be prevented from overlapping the light emitting region LA and being viewed by users by light emitted from the light emitting elements LD-G and LD-R.

Figure 10:
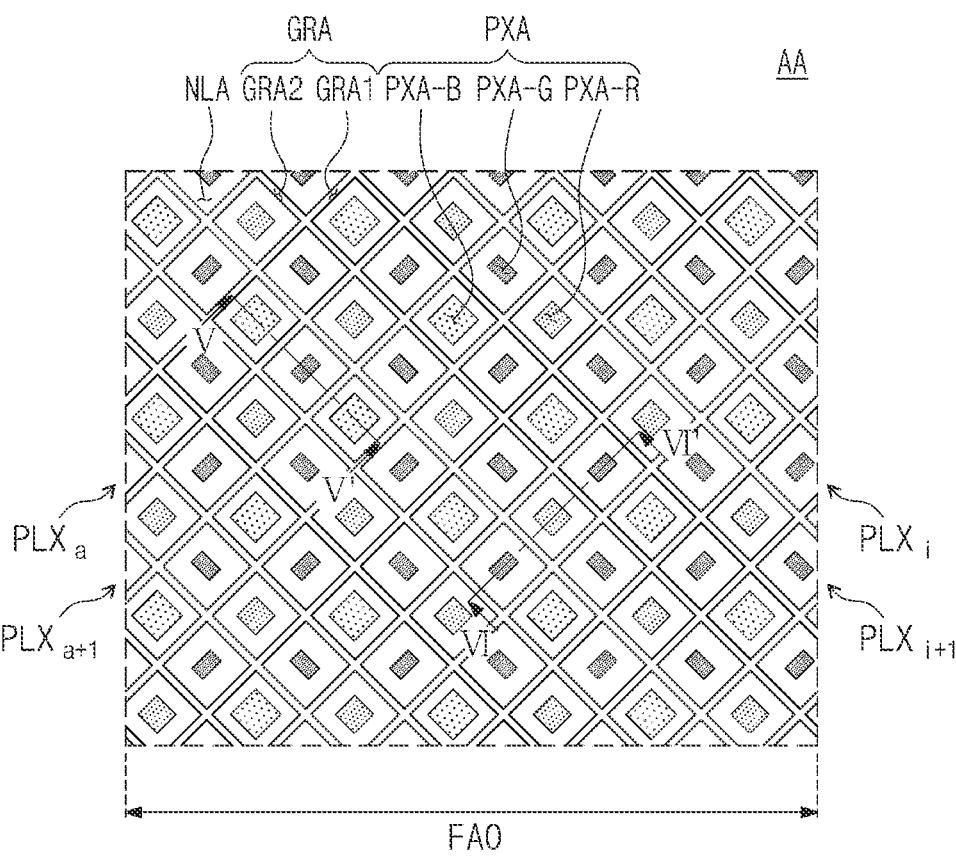
FIG. 10 is a plan view of a partial region of an electronic device according to an embodiment of the inventive concept.
Figure 10:
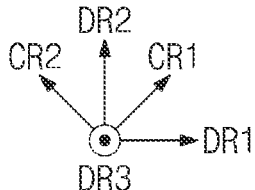

FIG. 10 is a plan view of a partial region of an electronic device ED (see FIG. 1A) according to an embodiment of the inventive concept. FIG. 10 is a plan view enlarging region AA of FIG. 1A.

Referring to FIG. 10, except for a first groove region GRA1 and a second groove region GRA2, since it is the same as the region AA described in FIG. 7, descriptions of the same components are omitted.

The first color light emitting element region PXA-B and the second color light emitting element region PXA-G may be alternately disposed in an (a)-th light emitting element row PLXa. The (a)-th light emitting element row PLXa may extend in the first oblique direction CR1 and may be arranged adjacent to other light emitting rows along the second oblique direction CR2. The second color light emitting element region PXA-G and the third color light emitting element region PXA-R may be alternately disposed in an (a+1)-th light emitting element row PLXa+1. The (a+1)-th light emitting element row PLXa+1 may extend in the first oblique direction CR1 and may be arranged adjacent to other light emitting rows along the second oblique direction CR2.

The groove region GRA may include a first groove region GRA1 and a second groove region GRA2. The groove region GRA may overlap the non-light emitting region NLA of the folding region FA0. The first groove region GRA1 may be a region corresponding to the first groove PF-GR1 (see FIG. 11). The second groove region GRA2 may be a region corresponding to the second groove PF-GR2 (see FIG. 12).

The first groove region GRA1 may extend along the first oblique direction CR1 and may be disposed between the plurality of light emitting element regions PXA-B, PXA-G, and PXA-R. The first groove region GRA1 may extend along the first oblique direction CR1 and may be arranged with a width along the second oblique direction CR2. The second groove region GRA2 may extend along the second oblique direction CR2 and may be arranged with a width along the first oblique direction CR1.

The first groove region GRA1 may be disposed between the (a)-th light emitting element row PLXa and the (a+1)-th light emitting element row PLXa+1. The (a)-th light emitting element row PLXa or the (a+1)-th light emitting element row PLXa+1 may be disposed between the mutually closest first groove regions GRA1.

The first groove region GRA1 and the second groove region GRA2 may cross each other. The first groove region GRA1 and the second groove region GRA2 may surround at least one light emitting element region among the plurality of light emitting element regions PXA-B, PXA-G, and PXA-R. As shown in FIG. 10, the first groove region GRA1 and the second groove region GRA2 may surround one light emitting element region. In this case, although the first groove region GRA1 and the second groove region GRA2 have been described separately, the two may be substantially connected as a single region.

Figure 11:
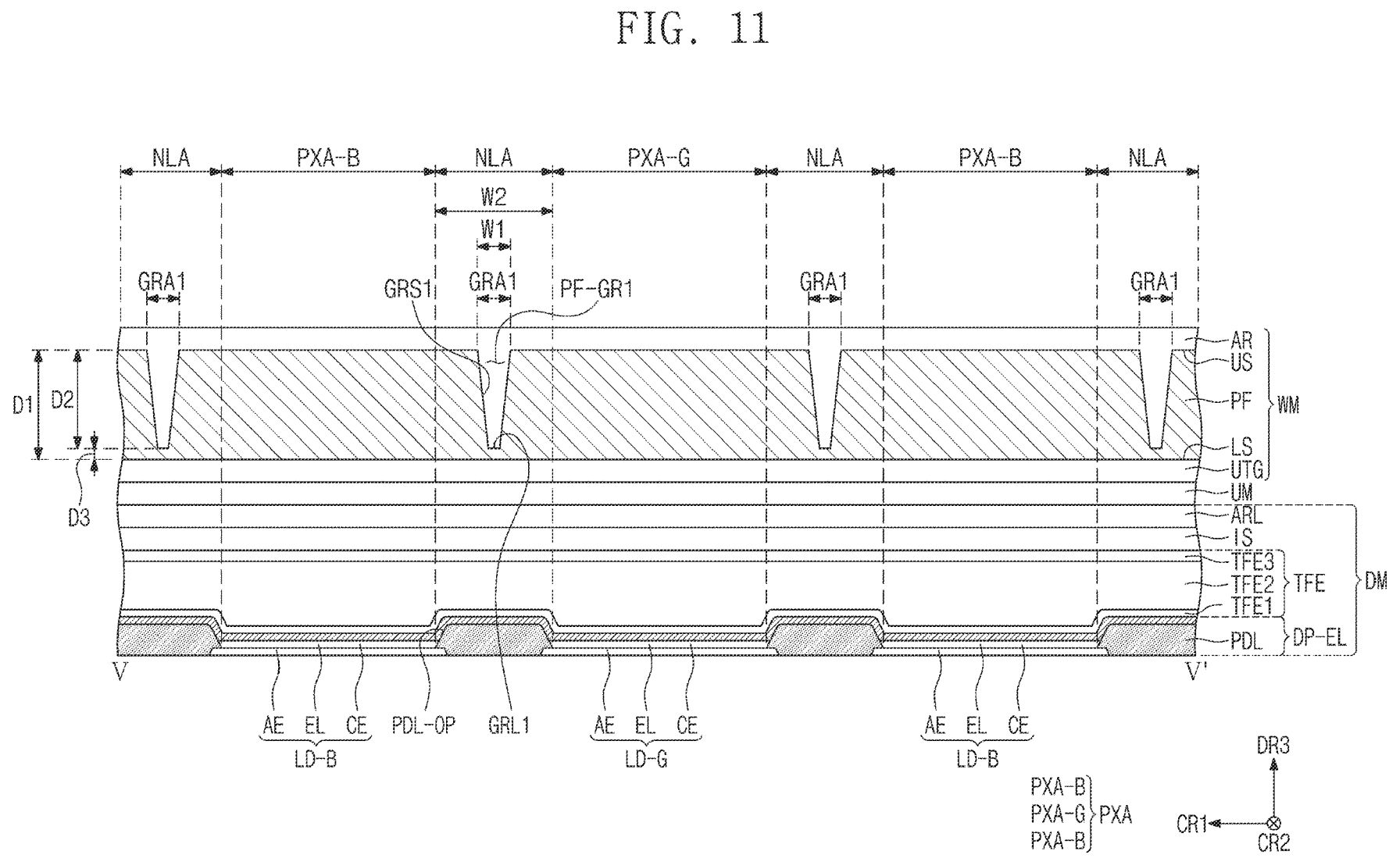
Figure 12:
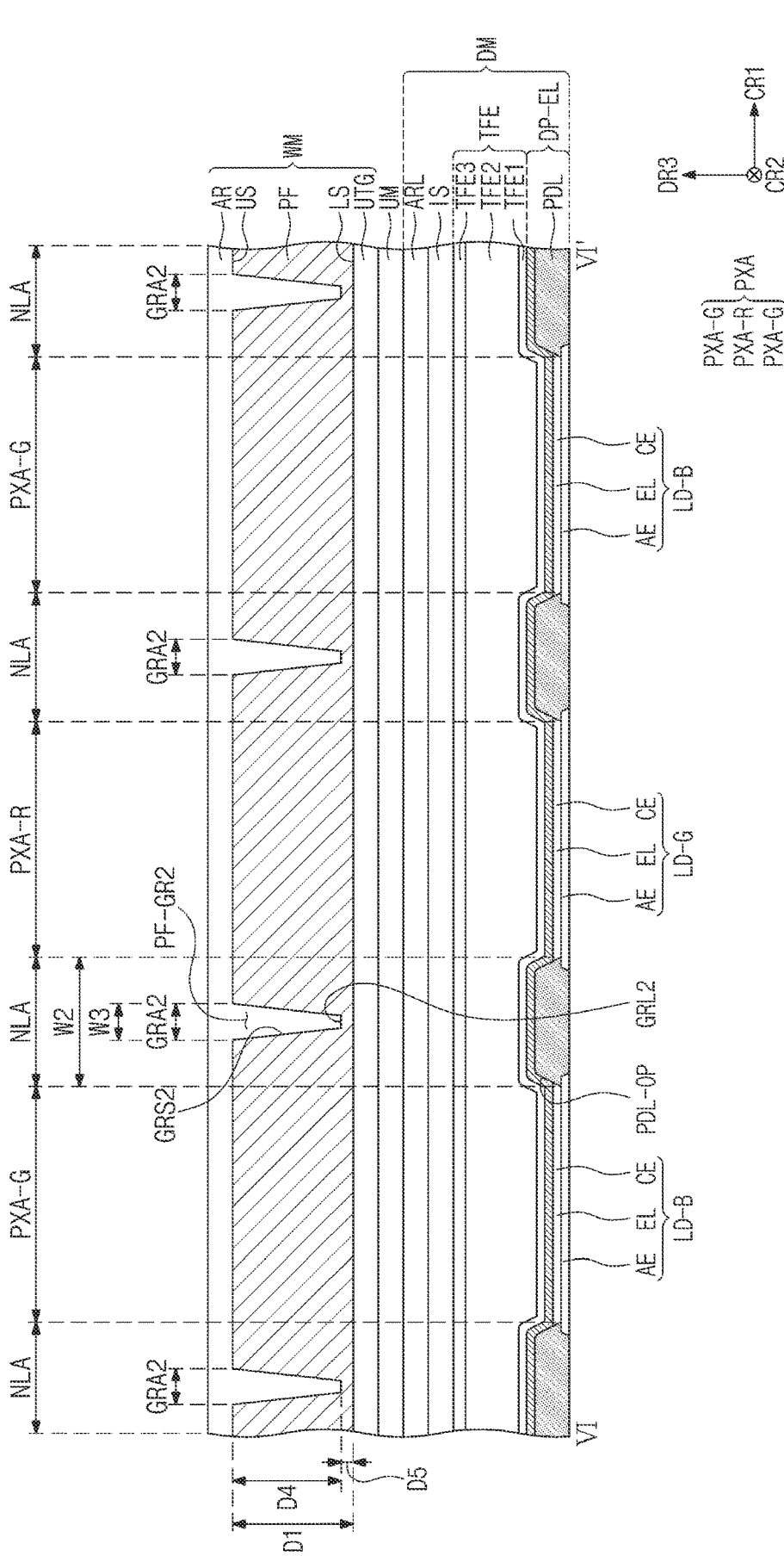
FIG. 12 is a cross-sectional view along VI-VI' of FIG. 10 according to an embodiment of the inventive concept.

FIG. 11 is a cross-sectional view along line V-V' of FIG. 10 according to an embodiment of the inventive concept, and FIG. 12 is a cross-sectional view along line VI-VI' of FIG. 10 according to an embodiment of the inventive concept.

Referring to FIGS. 11 and 12, a plurality of first grooves PF-GR1 may be provided, and depths D2 may each be the same. A plurality of second grooves PF-GR2 may be provided, and depths D4 may each be the same. The depth D2 of the first groove PF-GR1 may be the same as the depth D4 of the second groove PF-GR2.

The first groove PF-GR1 may be defined by the first inclined surface GRS1 and the first lower surface GRL1 of the window protection layer PF. The second groove PF-GR2 may be defined by the second inclined surface GRS2 and the second lower surface GRL2 of the window protection layer PF. An inclination angle between the first inclined surface GRS1 and the second inclined surface GRS2, and the lower surface LS of the window protection layer PF may vary as needed.

A difference D5 between the depth D4 of the second groove PF-GR2 and the thickness D1 of the window protection layer PF may be about 50 μm to about 80 μm. When the difference D5 between the depth D4 of the second groove PF-GR2 and the thickness D1 of the window protection layer PF is less than 50 μm, the window protection layer PF overlapping the second groove PF-GR2 may be too thin to protect components disposed below the window protection layer PF. When the difference D5 between the depth D4 of the second groove PF-GR2 and the thickness D1 of the window protection layer PF is greater than 80 μm, excessive force is required when the window protection layer PF is folded, and accordingly, an excessively large stress may be applied to the display device DD (see FIG. 6).

A width W1 of the first groove PF-GR1 and a width W3 of the second groove PF-GR2 may be the same. Accordingly, the first groove PF-GR1 and the second groove PF-GR2 positioned around the light emitting elements LD-B, LD-G, and LD-R may have a consistent shape to evenly distribute stress resulting from folding.

FIGS. 13 to 16 are plan views of a partial region of an electronic device ED (see FIG. 1A) according to an embodiment of the inventive concept. FIGS. 13 to 16 may be a plan view enlarging region AA of FIG. 1A.

Referring to FIGS. 13 to 16, the groove region GRA may have various arrangements. FIGS. 13 to 16 show various arrangements of the groove regions GRA as an example, and the arrangement of the groove regions GRA may vary as needed.

Figure 13:
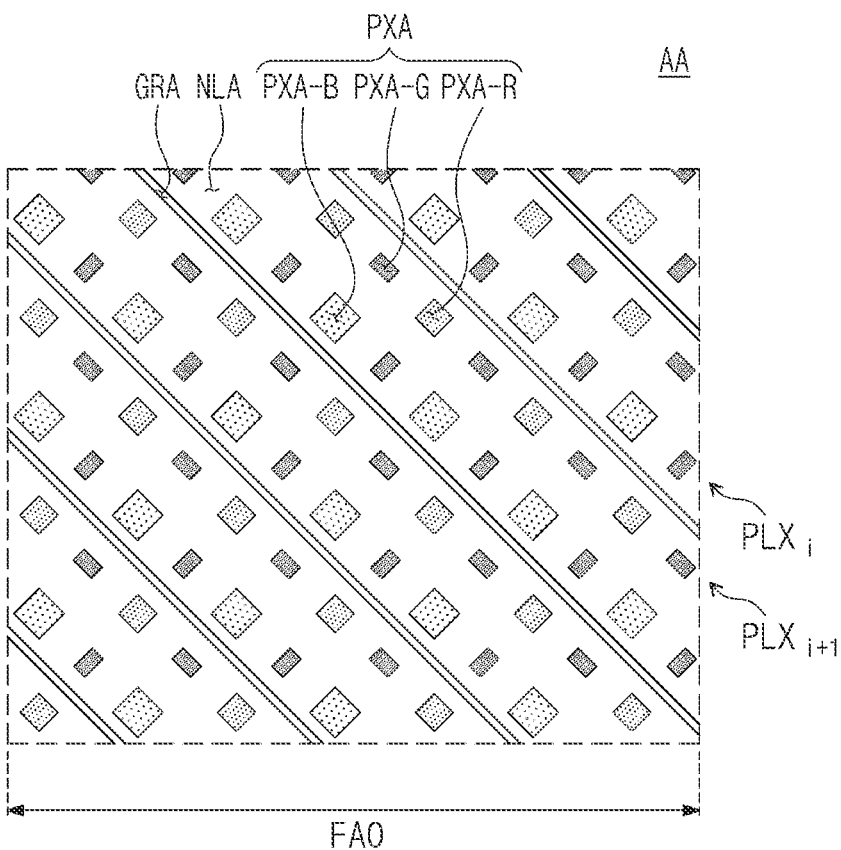
FIGS. 13, 14, 15, and 16 are plan views of a partial region of an electronic device according to an embodiment of the inventive concept.
Figure 13:
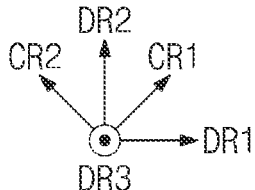

Referring to FIG. 13, the groove region GRA may be disposed between the (i)-th light emitting element row PLXi and the (i+1)-th light emitting element row PLXi+1. The groove region GRA may extend in the same direction as the (i)-th light emitting element row PLXi and the (i+1)-th light emitting element row PLXi+1. A plurality of groove regions GRA may be provided. The (i)-th light emitting element row PLXi and the (i+1)-th light emitting element row PLXi+1 may be disposed between the mutually closest groove regions GRA. That is, two light emitting element rows may be disposed between the mutually closest groove regions GRA.

Figure 14:
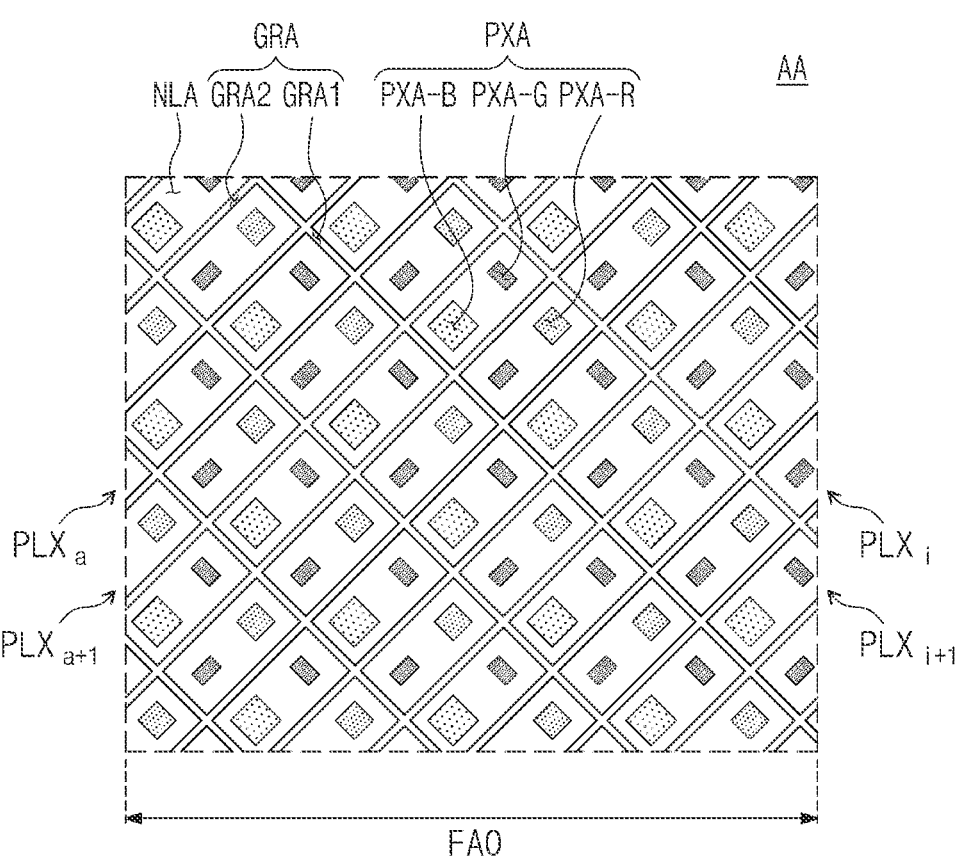
Figure 14:
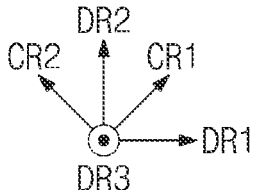

Referring to FIG. 14, the groove region GRA may include a first groove region GRA1 and a second groove region GRA2. The first groove region GRA1 may be disposed between the (i)-th light emitting element row PLXi and the (i+1)-th light emitting element row PLXi+1. The second groove region GRA2 may be disposed between the (a)-th light emitting element row PLXa and the (a+1)-th light emitting element row PLXa+1.

A plurality of first groove regions GRA1 may be provided. A plurality of second groove regions GRA2 may be provided. The (i)-th light emitting element row PLXi and the (i+1)-th light emitting element row PLXi+1 may be disposed between the mutually closest first groove regions GRA1. The (a)-th light emitting element row PLXa or the (a+1)-th light emitting element row PLXa+1 may be disposed between the mutually closest second groove regions GRA2. As such, the number of light emitting element rows disposed between the mutually closest first groove regions GRA1 and the number of light emitting element rows disposed between the mutually closest second groove regions GRA2 may be different.

The first groove region GRA1 and the second groove region GRA2 may surround the first color light emitting element region PXA-B and the second color light emitting element region PXA-G. The first groove region GRA1 and the second groove region GRA2 may surround the second color light emitting element region PXA-G and the third color light emitting element region PXA-R.

Figure 15:
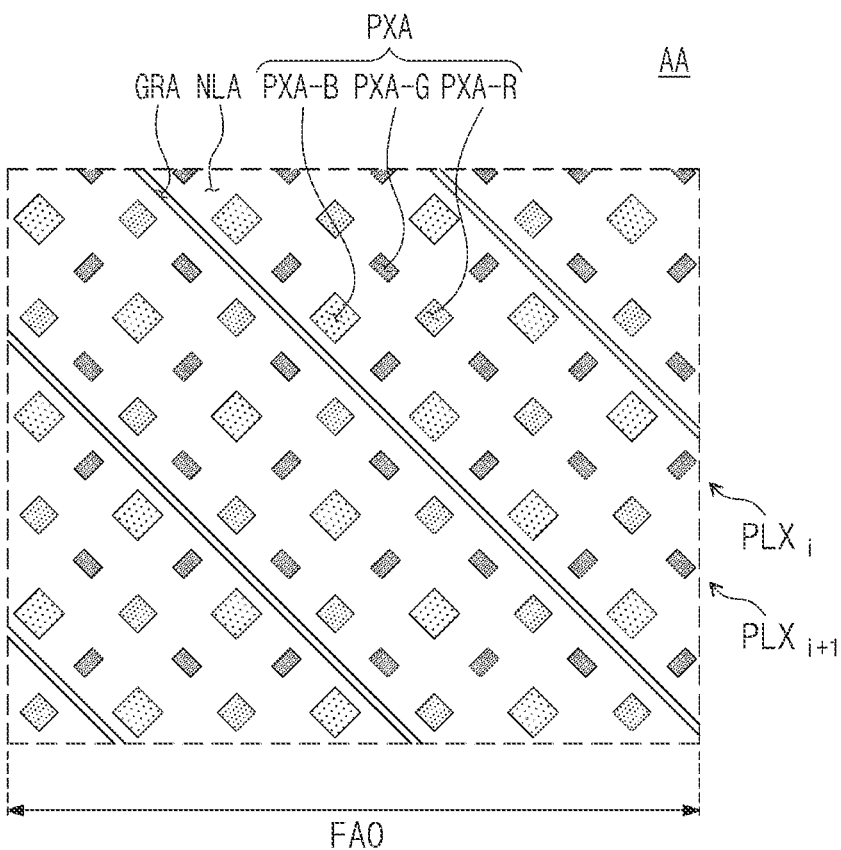
Figure 15:
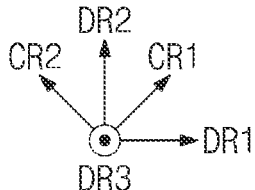

FIG. 14 shows two light emitting element rows (i.e. the (i)-th light emitting element row PLXi and the (i+1)-th light emitting element row PLXi+1) between two first grooves GRA1. More generally, n light emitting element rows may be provided between the two first grooves GRA1 where n is a natural number greater than one. FIG. 15 depicts such a configurations where n is 3, which is discussed more fully below.

FIG. 14 shows one light emitting row (i.e. the (a)-th light emitting element row PLXa or the (a+1)-th light emitting element row PLXa+1) between two second grooves GRA2. More generally, m light emitting rows may be provided between two second grooves GRA2 where m is a natural number greater than one.

Referring to FIG. 15, the groove region GRA may be disposed between the (i)-th light emitting element row PLXi and the (i+1)-th light emitting element row PLXi+1. A plurality of groove regions GRA may be provided. That is, three light emitting element rows may be disposed between the mutually closest groove regions GRA. One (i)-th light emitting element row PLXi, an (i+1)-th light emitting element row PLXi+1, and another (i)-th light emitting element row PLXi may be disposed between the mutually closest groove regions GRA. As such, when the distance between the mutually closest groove regions GRA widens, an area occupied by the groove regions GRA within the same area may be reduced. Accordingly, users may have improved viewability.

Figure 16:
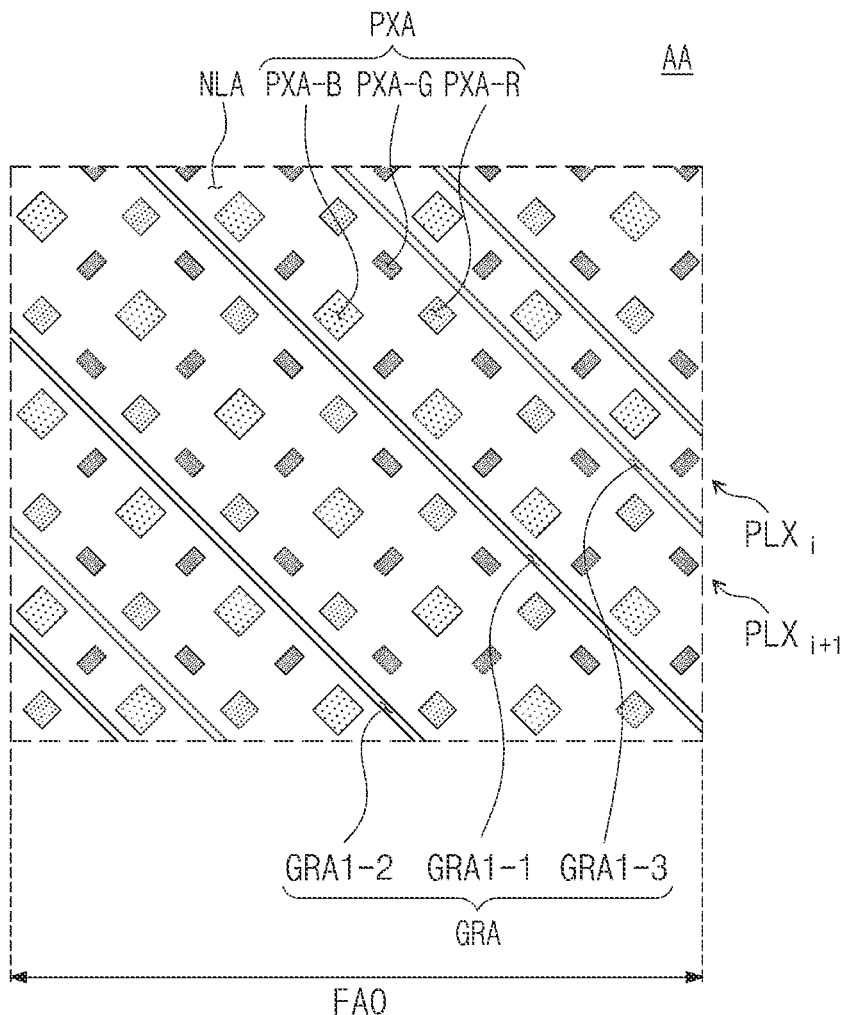
Figure 16:
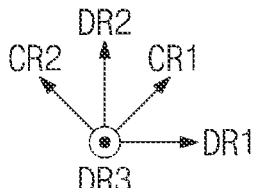

Referring to FIG. 16, the groove region GRA may include a (1-1)-th groove region GRA1-1, a (1-2)-th groove region GRA1-2, and a (1-3)-th groove region GRA1-3. A plurality of groove regions GRA may be provided, and intervals between the mutually closest groove regions GRA1-1, GRA1-2, and GRA1-3 may not be the same. For example, the distance between the (1-1)-th groove region GRA1-1 and the (1-2)-th groove region GRA1-2 closest to one side of the (1-1)-th groove region GRA1-1 may be greater than the distance between the (1-1)-th groove region GRA1-1 and the (1-3)-th groove region GRA1-3 closest to the other side of the (1-1)-th groove region GRA1-1.

Three light emitting element rows extending in the second oblique direction CR2 may be disposed between the (1-1)-th groove region GRA1-1 and the (1-2)-th groove region GRA1-2. Two light emitting element rows extending in the second oblique direction CR2 may be disposed between the (1-1)-th groove region GRA1-1 and the (1-3)-th groove region GRA1-3. As such, the intervals between the mutually closest groove regions GRA are not uniform, and thus, the Moiré phenomenon, which is an interference phenomenon of light that tends to take place in patterns with regular intervals, may be prevented. Accordingly, users may have improved viewability on the display device DD (see FIG. 6).

FIGS. 17 to 20 are cross-sectional views showing a method for manufacturing the display device DD (see FIG. 6) according to an embodiment of the inventive concept.

Figure 17:
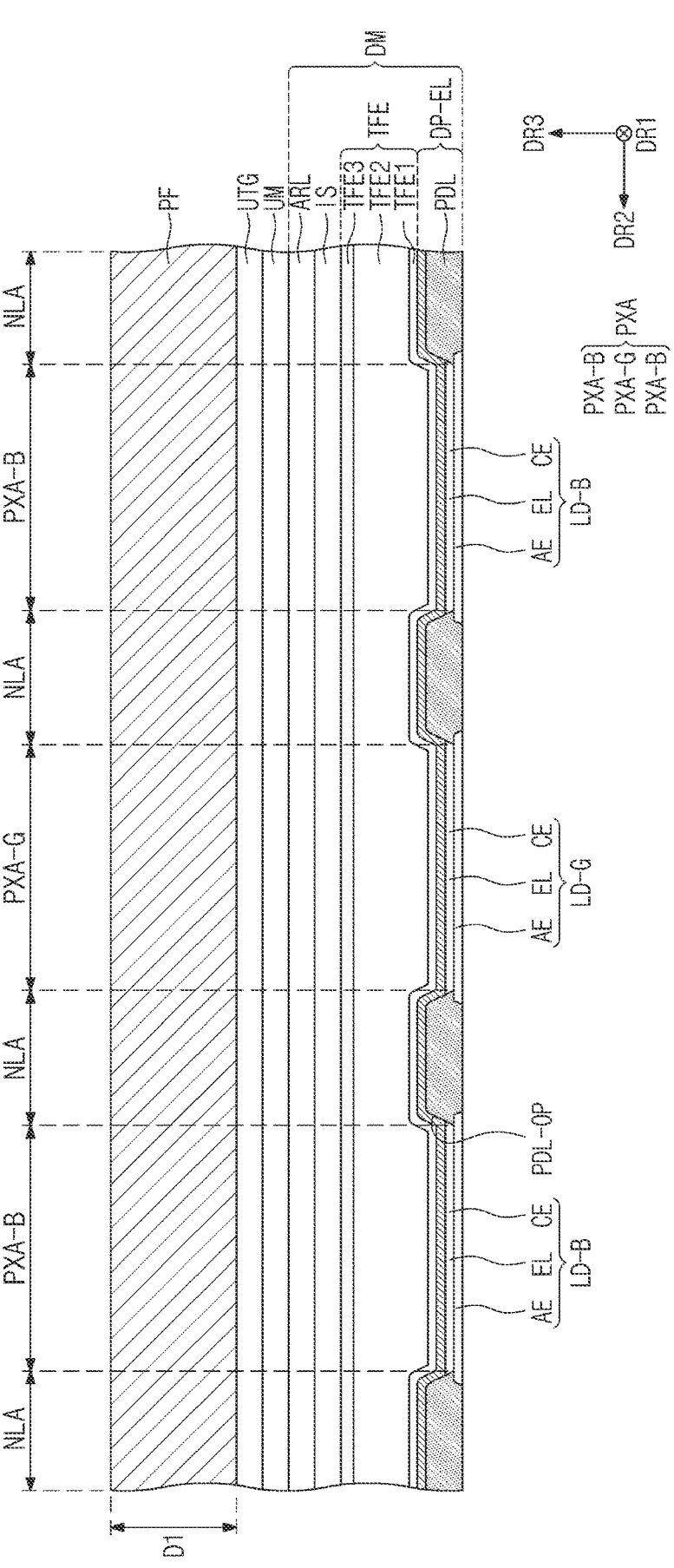

Referring to FIG. 17, a preliminary display device including a display module DM including a light emitting element layer DP-EL and an encapsulation layer TFE, and a window UTG disposed on the display module DM, and a window protection layer PF disposed on the window UTG may be prepared. In this case, the window protection layer PF may have a thickness D1 of about 100 μm to about 350 μm.

Figure 18:
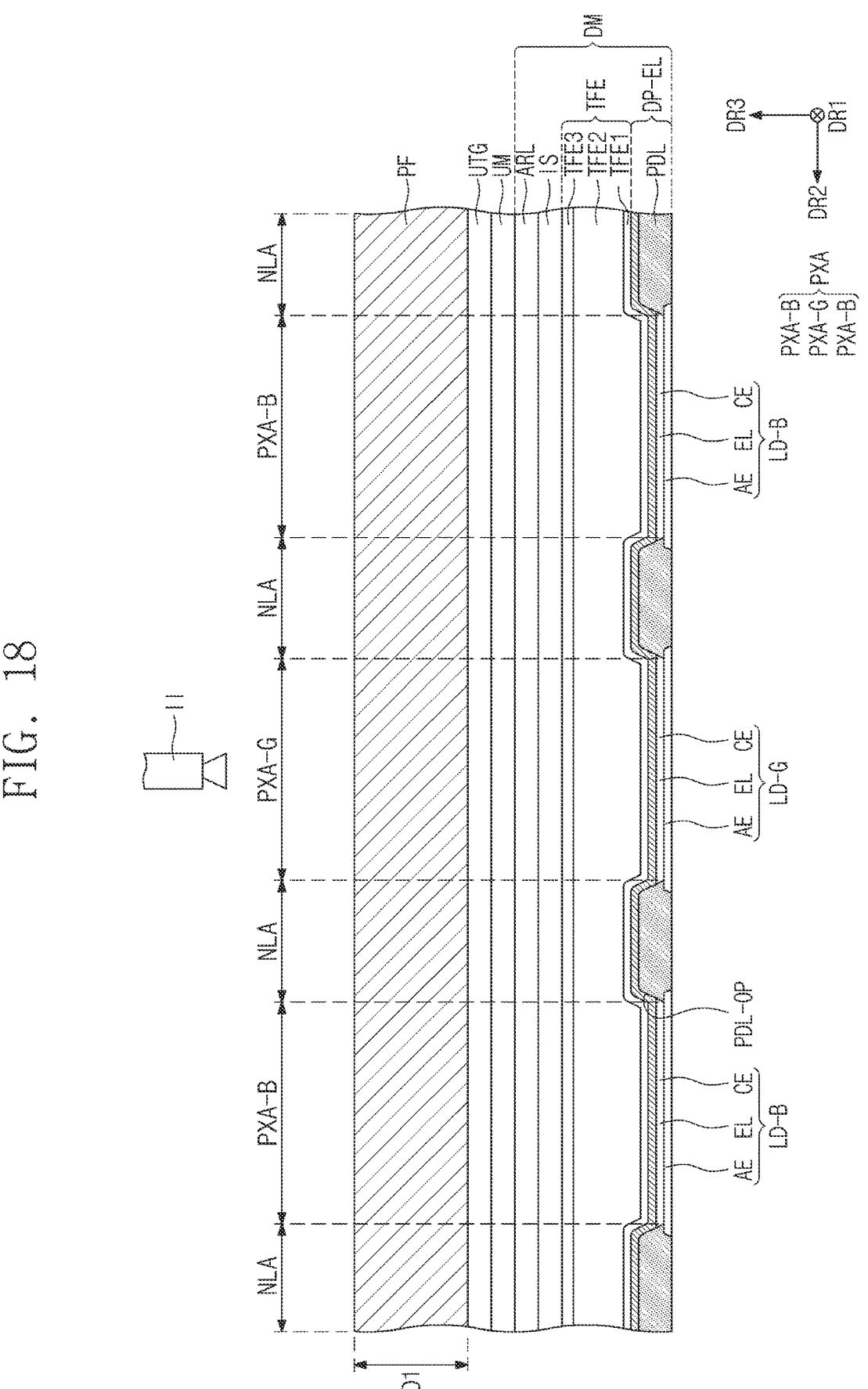

Referring to FIG. 18, coordinates of each of the light emitting elements LD-B and LD-G may be determined using an inspection instrument II. The inspection instrument II may measure light emitted from the light emitting elements LD-B and LD-G, and determine and store the coordinates of each of the light emitting elements LD-B and LD-G. The coordinates of each of the light emitting elements LD-B and LD-G determined through the inspection instrument II may be used when the groove PF-GR is formed later. The inspection instrument II may be any instrument that may determine the coordinates of each of the light emitting elements LD-B and LD-G.

Figure 19:
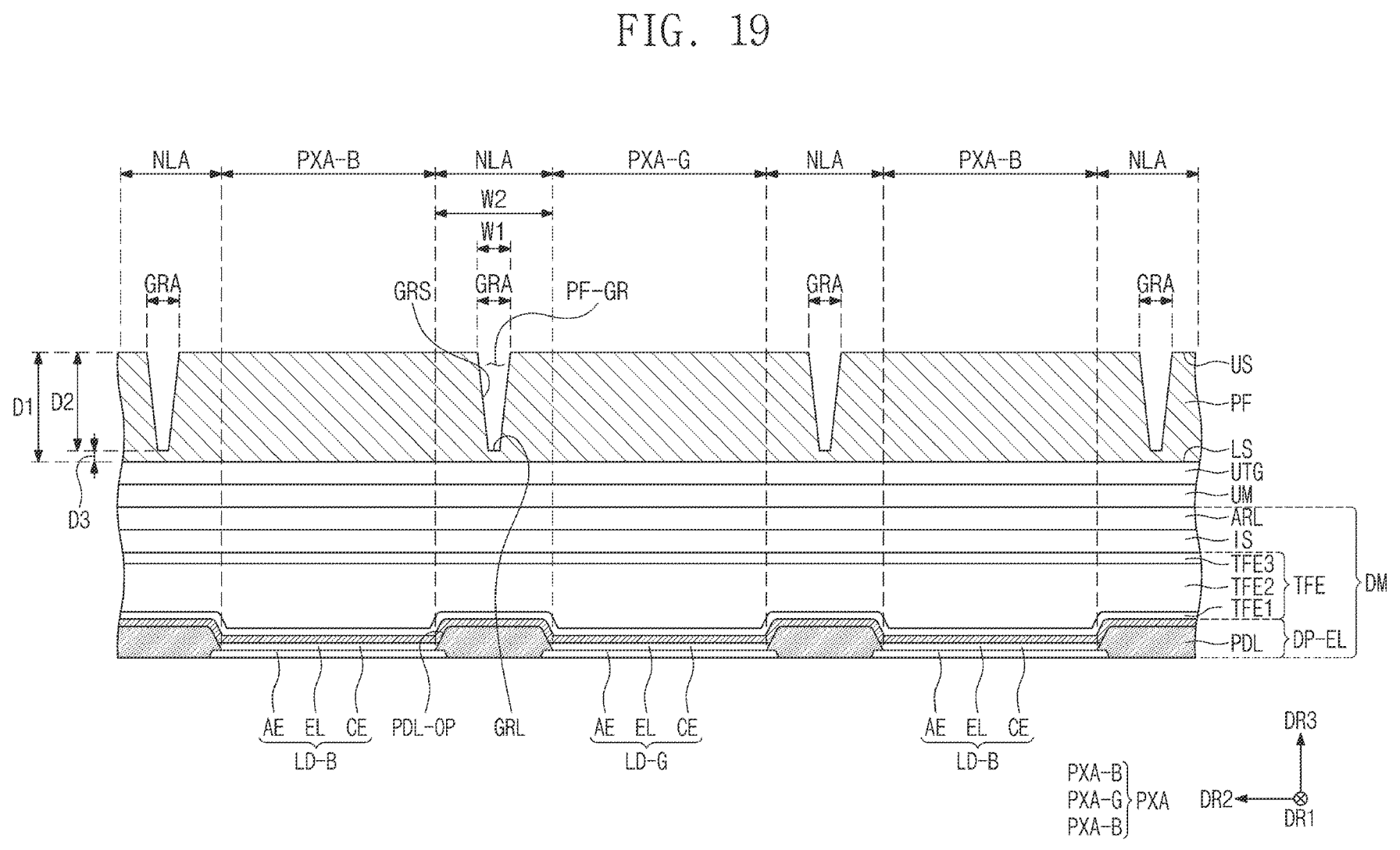

Referring to FIG. 19, a groove PF-GR overlapping a non-light emitting region NLA may be formed on an upper surface US of the window protection layer PF. A portion of the window protection layer PF overlapping the non-light emitting region NLA may be etched to form the groove PF-GR. The groove PF-GR may be formed to be spaced apart from each of the light emitting elements LD-B and LD-G by a predetermined distance without overlapping the light emitting elements LD-B and LD-G. When forming the groove PF-GR, an etching process using a laser may be used.

Figure 20:
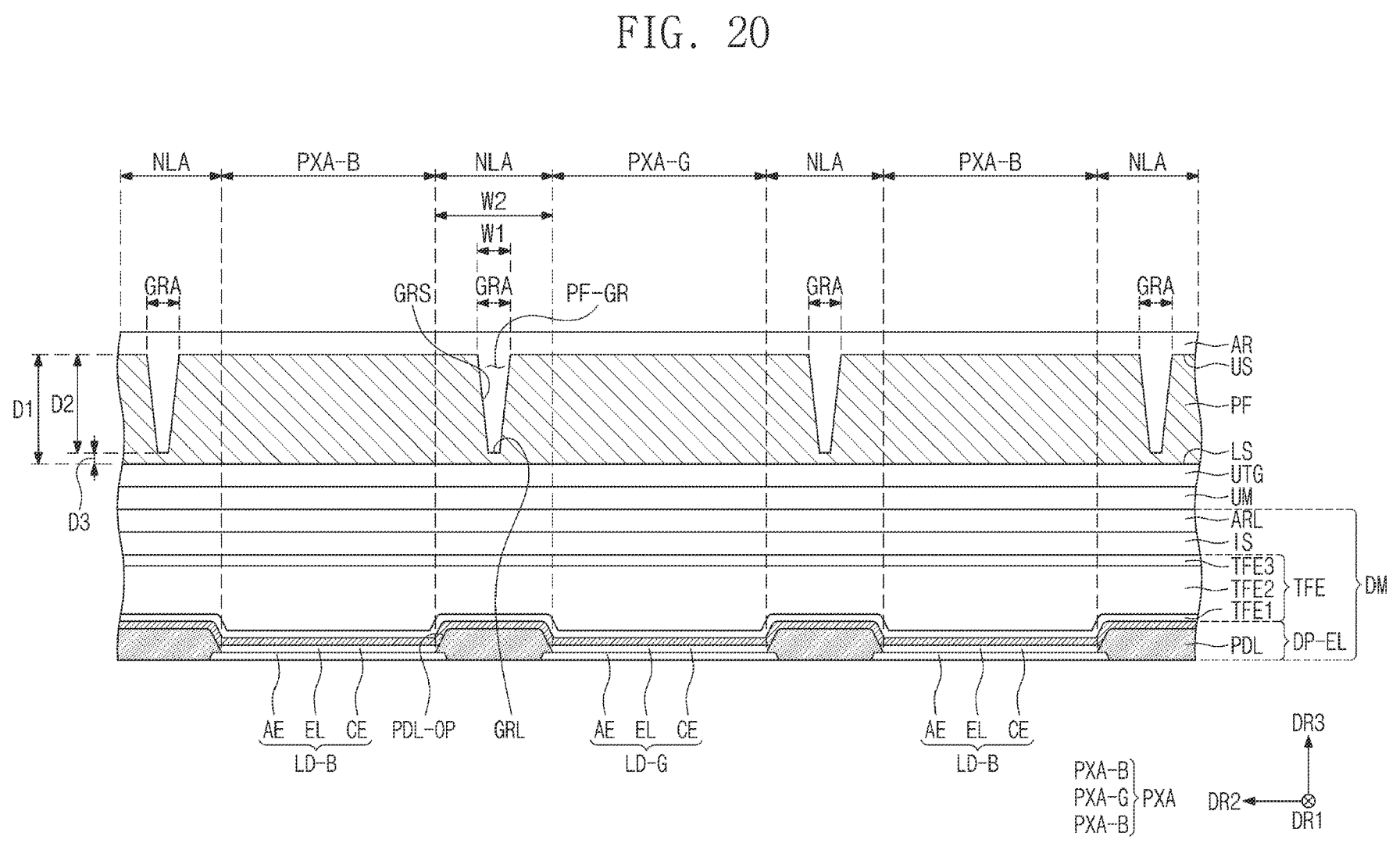

Referring to FIG. 20, an upper protection layer AR filling the groove PF-GR may be formed on the window protection layer PF. The upper protection layer AR may be formed to have a flat upper surface despite the stepped upper surface US of the window protection layer PF. The upper protection layer AR may directly contact an inclined surface GRS and a lower surface GRL of the window protection layer PF defining the groove PF-GR. The upper protection layer AR may include a material having the same refractive index as the window protection layer PF. For example, the upper protection layer AR may be formed by filling a resin having the same refractive index as the window protection layer PF. However, the material of the upper protection layer AR is not limited thereto and various materials may be used.

According to an embodiment of the inventive concept, as a window protection layer has a greater thickness and a groove is defined in a folding region, folding may be easily performed and a display device may have improved impact resistance.

In addition, the groove of the window protection layer may overlap a non-light emitting region, and an upper protection layer having the same refractive index as that of the window protection layer may be provided on the window protection layer to increase viewability of users.

Although the present disclosure has been described with reference to embodiments of the inventive concept, it will be understood that the inventive concept should not be limited to these embodiments but various changes and modifications may be made by those skilled in the art without departing from the spirit and scope of the present disclosure. Hence, the scope of the present disclosure is not limited to the detailed descriptions in the specification but should be determined with reference to the claims.

What is claimed is:

1. A display device comprising:
   a display panel including a first non-folding region, a second non-folding region, and a folding region which is foldable and disposed between the first non-folding region and the second non-folding region, wherein the first non-folding region, the second non-folding region, and the folding region each include light emitting regions in which light emitting elements respectively overlap and a non-light emitting region disposed between the light emitting regions;
   a window disposed on the display panel; and
   a window protection layer having a first groove overlapping the folding region defined therein, and disposed on the window,
   wherein the first groove overlaps the non-light emitting region of the folding region when viewed on a plane,
   wherein the folding region is foldable along a folding axis that is parallel to a first direction,
   wherein the first non-folding region and the second non-folding region extend from folding region in a second direction crossing the first direction, and
   wherein the first groove extends in a first oblique direction crossing the first direction and the second direction.

2. The display device of claim 1, further comprising an upper protection layer disposed on the window protection layer and filling the first groove.

3. The display device of claim 2, wherein the window protection layer and the upper protection layer have the same refractive index.

4. The display device of claim 1, wherein the window protection layer has a thickness of about 100 μm or more and about 350 μm or less.

5. The display device of claim 1, wherein a depth of the first groove is smaller than a thickness of the window protection layer by about 50 μm or more and about 80 μm or less.

6. The display device of claim 1, wherein a width of the first groove is smaller than a distance between the light emitting elements.

7. The display device of claim 1, further comprising a second groove extending in a second oblique direction crossing the first direction, the second direction, and the first oblique direction.

8. The display device of claim 7, wherein:

the first groove is defined in plurality;

each of the first grooves has the same depth;

the second groove is defined in plurality; and each of the second grooves has the same depth.

9. The display device of claim 8, wherein some of the light emitting elements are disposed between the mutually adjacent first grooves, the some of the light emitting elements define at least one light emitting element row, and the at least one light emitting element row extends in the first oblique direction.

10. The display device of claim 8, wherein a first distance between a (1-1)-th groove, which is one of the first grooves, and a (1-2)-th groove closest to one side of the (1-1)-th groove is greater than a second distance between the (1-1)-th groove and a (1-3)-th groove closest to the other side of the (1-1)-th groove.

11. The display device of claim 8, wherein one of the light emitting elements is surrounded by the first groove and the second groove.

12. The display device of claim 8, wherein a depth of the first groove is the same as a depth of the second groove.

13. The display device of claim 8, wherein some of the light emitting elements define n first light emitting element rows between the mutually closest first grooves, some of the light emitting elements define m second light emitting element rows between the mutually closest second grooves, and the n and the m are different natural numbers.

14. The display device of claim 9, wherein the number of the light emitting element rows disposed between the mutually closest first grooves is the same.

15. A method of manufacturing a display device, the method comprising:

preparing a preliminary display device that includes a display panel including a first non-folding region, a second non-folding region, and a folding region which is foldable and disposed between the first non-folding region and the second non-folding region, wherein the first non-folding region, the second non-folding region, and the folding region each include light emitting regions in which light emitting elements respectively overlap and a non-light emitting region disposed between the light emitting regions, a window disposed on the display panel, and a window protection layer disposed on the window;

determining coordinates of each of the light emitting elements, using an inspection instrument; and forming a first groove overlapping the non-light emitting region of the folding region in the window protection layer, wherein the folding region is foldable along a folding axis that is parallel to a first direction, wherein the first non-folding region and the second non-folding region extend from folding region in a second direction crossing the first direction, and wherein the first groove extends in a first oblique direction crossing the first direction and the second direction.

16. The method of claim 15, further comprising forming an upper protection layer disposed on the window protection layer and filling the groove.

17. The method of claim 15, wherein the window protection layer has a thickness of about 100 μm or more and about 350 μm or less.

18. The method of claim 15, wherein a depth of the first groove is smaller than a thickness of the window protection layer by about 50 μm or more and about 80 μm or less.

19. The method of claim 15, wherein a width of the first groove is smaller than a distance between the light emitting elements.

20. The method of claim 16, wherein the window protection layer and the upper protection layer have the same refractive index.

\* \* \* \* \*